(12) United States Patent
Yamada et al.

(10) Patent No.: US 11,582,889 B2
(45) Date of Patent: Feb. 14, 2023

(54) SEMICONDUCTOR MODULE AND VEHICLE

(71) Applicant: FUJI ELECTRIC CO., LTD., Kanagawa (JP)

(72) Inventors: Takafumi Yamada, Matsumoto (JP); Hiromichi Gohara, Matsumoto (JP); Daiki Yoshida, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 384 days.

(21) Appl. No.: 16/940,406

(22) Filed: Jul. 28, 2020

(65) Prior Publication Data
US 2021/0084799 A1 Mar. 18, 2021

(30) Foreign Application Priority Data
Sep. 13, 2019 (JP) .............................. JP2019-167785

(51) Int. Cl.
*H05K 7/20* (2006.01)
*H01L 23/46* (2006.01)
*H01L 25/07* (2006.01)

(52) U.S. Cl.
CPC ......... *H05K 7/20927* (2013.01); *H01L 23/46* (2013.01); *H05K 7/209* (2013.01); *H01L 25/072* (2013.01)

(58) Field of Classification Search
CPC .... H05K 7/20927; H05K 7/209; H01L 23/46; H01L 25/072; H01L 23/473; H01L 23/22; H01L 23/373; H01L 23/4336; H01L 23/44; H01L 23/445; H01L 23/4735

USPC ......................................................... 257/714
See application file for complete search history.

(56) References Cited

U.S. PATENT DOCUMENTS

| 10,214,109 B2 | 2/2019 | Gohara | |
|---|---|---|---|
| 2005/0069432 A1* | 3/2005 | Tomioka | H01L 23/473 |
| | | | 257/E23.098 |
| 2007/0134951 A1* | 6/2007 | Inagaki | H05K 3/284 |
| | | | 439/74 |

(Continued)

FOREIGN PATENT DOCUMENTS

| JP | 2012064609 A | 3/2012 |
|---|---|---|
| JP | 2016018904 A | 2/2016 |

(Continued)

*Primary Examiner* — Allen L Parker
*Assistant Examiner* — David W Houston, III

(57) ABSTRACT

A semiconductor module includes a semiconductor device, and a cooling device. The semiconductor device includes a semiconductor chip and a circuit board for mounting the chip. The cooling device includes a top plate mounted in the semiconductor device and having a side wall connected thereto, a bottom plate connected to the side wall, and a refrigerant circulating portion, defined by the top plate, the side wall, and the bottom plate and has a substantially rectangular shape with a cross section parallel to a main surface of the top plate having long and short sides. The circuit board is a substantially rectangular laminated circuit board including an insulating plate having an upper surface with a circuit layer and a lower surface with a metal layer. In a plan view, at least one corner of the metal layer at least partially overlaps with the slope portion of the side wall.

15 Claims, 17 Drawing Sheets

(56) References Cited

U.S. PATENT DOCUMENTS

| | | | | |
|---|---|---|---|---|
| 2013/0126916 A1* | 5/2013 | Arai | ................... | H01L 24/19 |
| | | | | 438/122 |
| 2014/0252590 A1* | 9/2014 | Gohara | ................ | H01L 23/473 |
| | | | | 257/715 |
| 2015/0035134 A1* | 2/2015 | Hung | ..................... | H01L 24/92 |
| | | | | 257/712 |
| 2015/0351283 A1* | 12/2015 | Yamada | ................. | F28F 13/08 |
| | | | | 165/80.4 |
| 2017/0271240 A1* | 9/2017 | Inoue | ................... | H01L 23/473 |
| 2018/0024599 A1* | 1/2018 | Sakata | ..................... | F28F 3/06 |
| | | | | 361/679.47 |
| 2019/0304874 A1* | 10/2019 | Arai | ................. | H01L 23/49861 |
| 2020/0266126 A1* | 8/2020 | Arai | ........................ | H01L 24/92 |
| | | | | 257/712 |

FOREIGN PATENT DOCUMENTS

| | | | | | |
|---|---|---|---|---|---|
| JP | 2019080016 A | | 5/2019 | | |
| JP | 2020136366 A | * | 8/2020 | ......... | H01L 21/4878 |
| WO | 2015079643 A1 | | 6/2015 | | |

\* cited by examiner

SEMICONDUCTOR MODULE AND VEHICLE

BACKGROUND

1. Technical Field

The present invention relates to a semiconductor module and a vehicle.

2. Related Art

Conventionally, a semiconductor module including a plurality of semiconductor elements such as a power semiconductor chip, in which a cooling device including cooling fins is mounted, is known (for example, see Patent Literatures 1 to 4).

CITATION LIST

[Patent Literature]

Patent Literature 1: Japanese Unexamined Patent Publication No. 2016-018904

Patent Literature 2: Japanese Unexamined Patent Publication No. 2012-064609

Patent Literature 3: Japanese Unexamined Patent Publication No. 2019-080016

Patent Literature 4: WO 2015/079643

SUMMARY

In order to solve the above problem, in a first aspect of the invention, there is provided a semiconductor module which includes a semiconductor device and a cooling device. The semiconductor device may include a semiconductor chip and a circuit board where the semiconductor chip is mounted. The cooling device may include a top plate where the semiconductor device is mounted. The cooling device may include a side wall which is connected to the top plate. The cooling device may include a bottom plate which is connected to the side wall and faces the top plate. The cooling device may include a refrigerant circulating portion for circulating a refrigerant, which is defined by the top plate, the side wall, and the bottom plate, and has a substantially rectangular shape of which the cross section parallel to the main surface of the top plate has a long side and a short side. The circuit board may be a substantially rectangular laminated circuit board which sequentially includes an insulating plate having an upper surface and a lower surface, a circuit layer provided in the upper surface, and a metal layer provided in the lower surface. In a plan view, the side wall may include a slope portion which is inclined inward to form an angle with respect to each of the direction of the long side and the direction of the short side at least at one corner. In a plan view, at least one corner of the metal layer may be at least partially overlapped with the slope portion.

In a plan view, the contour of at least one corner of the metal layer may be located between the inner side and the outer side of the slope portion.

In a plan view, portions other than the corners of the metal layer may be not overlapped with the side wall.

The side wall may include two slope portions at least at two corners. In a plan view, two corners of the metal layer may be at least partially overlapped with two slope portions.

In the direction of the short side, the length of one side on the inner side of the side wall may be shorter than the length of one side of the metal layer of the circuit board.

The insulating plate may contain ceramic. The metal layer may be fixed to the top plate by a solder.

The top plate and the side wall may be integrally configured.

The top plate and the side wall may be integrally formed.

The top plate and the side wall may be fixed by a fixing agent.

The thickness of the cross section of the top plate in a plane orthogonal to the direction in a plan view may be thicker on the outer side than on the inner side of the side wall.

In a second aspect of the invention provides, there is provided a semiconductor module which includes a semiconductor device and a cooling device. The semiconductor device may include a semiconductor chip. The semiconductor device may include a circuit board. The circuit board may include an insulating plate having an upper surface and a lower surface, a circuit layer provided in the upper surface, and a metal layer provided in the lower surface, and have the semiconductor chip mounted in the circuit layer. The cooling device may include a top plate where the semiconductor device is mounted. The cooling device may include a side wall which is connected to the top plate. The cooling device may include a bottom plate which is connected to the side wall and faces the top plate. The cooling device may include a refrigerant circulating portion for circulating the refrigerant which is defined by the top plate, the side wall, and the bottom plate. The side wall may include a set of first side wall elements which extend in one direction and face each other. The side wall may include a set of second side wall elements which extend in another direction and face each other. The side wall may include a slope portion which connects the end portion of the first side wall element and the end portion of the second side wall element. In a plan view, the metal layer is a substantially rectangular shape, and the corner of the metal layer may be partially overlapped with the slope portion.

In a plan view, the one direction and the other direction are orthogonal, an extending direction of the slope portion and the one direction may intersect at an angle of 30 degrees or more and 60 degrees or less.

The side wall may include four slope portions. In a plan view, the length of the second side wall element may be shorter than the length of the first side wall element, and the length of the second side wall element may be shorter than the length of one side of the metal layer.

The side wall may include two slope portions.

In a third aspect of the invention, there is provided a vehicle which includes the semiconductor module according to the first aspect and the semiconductor module according to the second aspect.

The summary clause does not necessarily describe all necessary features of the embodiments of the present invention. The present invention may also be a sub-combination of the features described above.

DESCRIPTION OF EXEMPLARY EMBODIMENTS

Hereinafter, the invention will be described through embodiments, but the following embodiments do not limit the invention according to the claims. In addition, not all of the combinations of features described in the embodiments are essential to the solving means of the invention.

Figure 1:
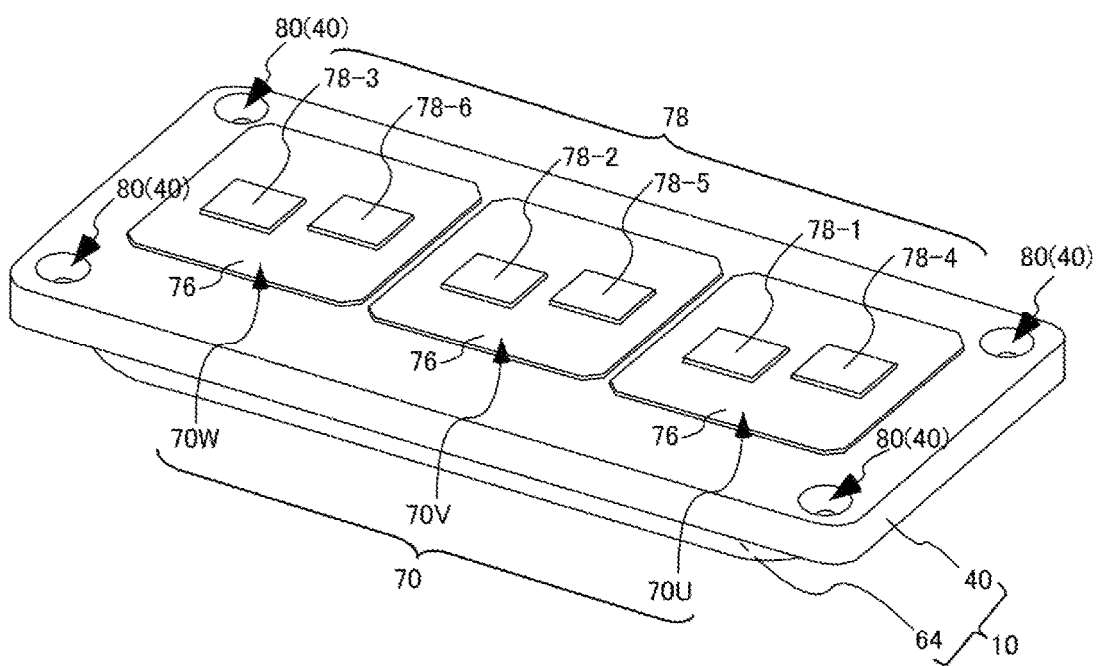
FIG. 1 is a schematic perspective view illustrating an example of a semiconductor module 100 according to an embodiment of the invention.
Figure 1:
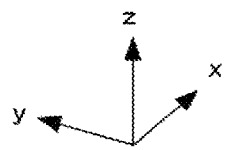
Figure 2:
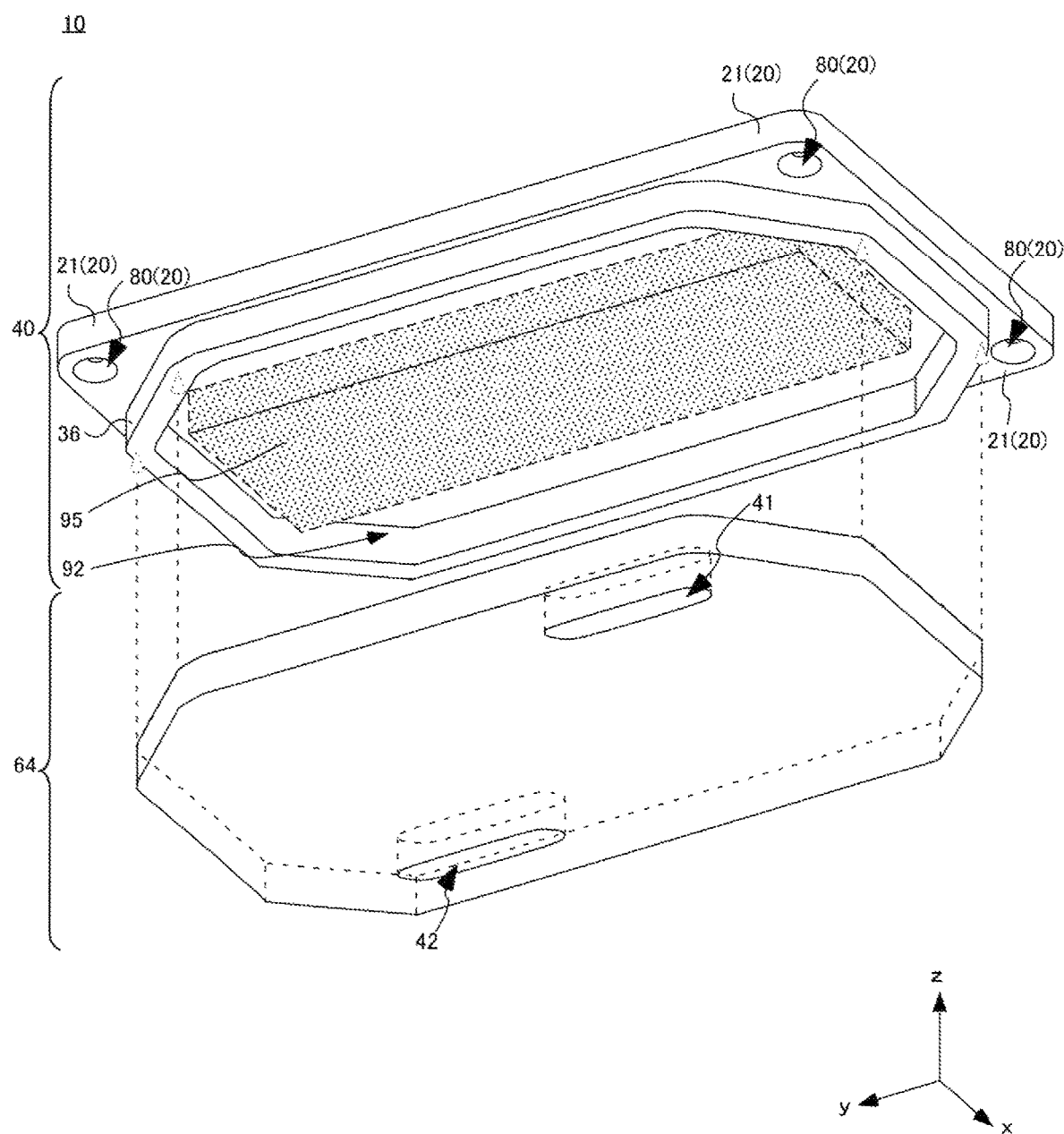
FIG. 2 is a schematic perspective view illustrating an example of a cooling device 10 of the semiconductor module 100 according to an embodiment of the invention.
Figure 3:
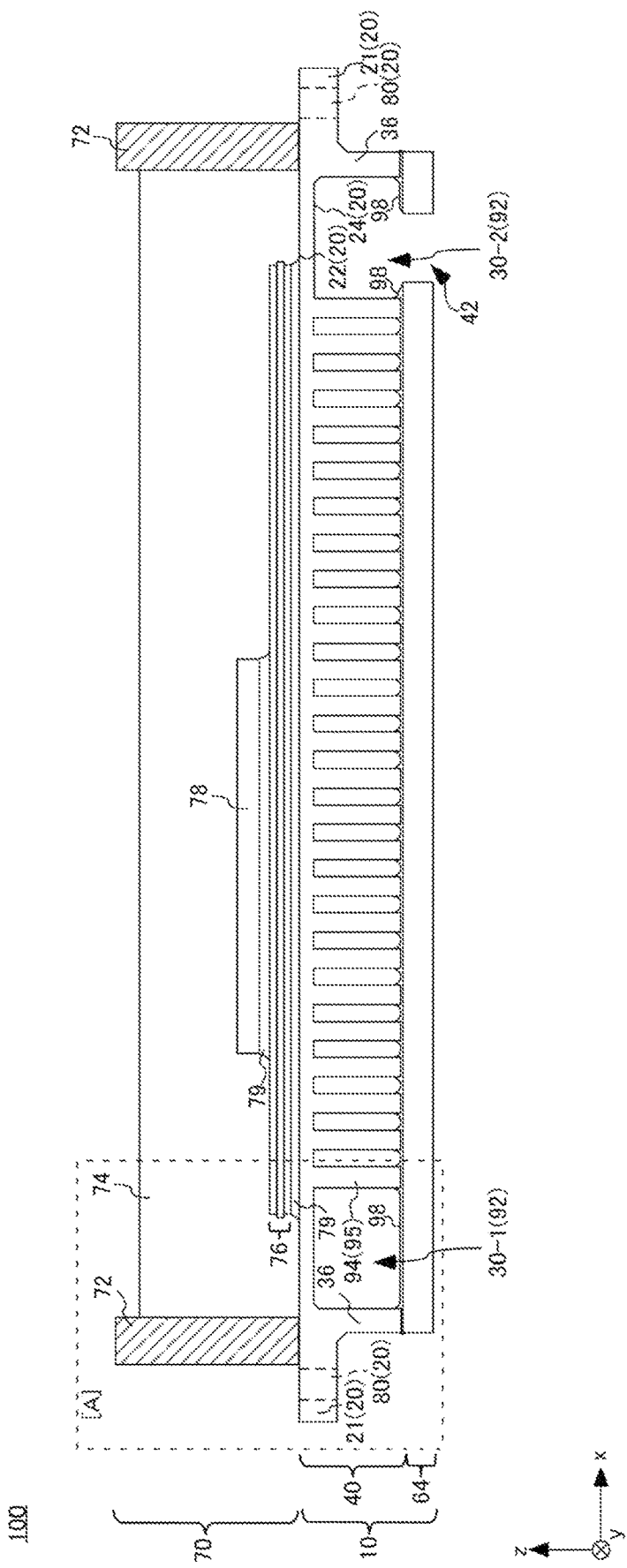
FIG. 3 is a schematic cross-sectional view illustrating an example of the semiconductor module 100 according to an embodiment of the invention.
Figure 4:
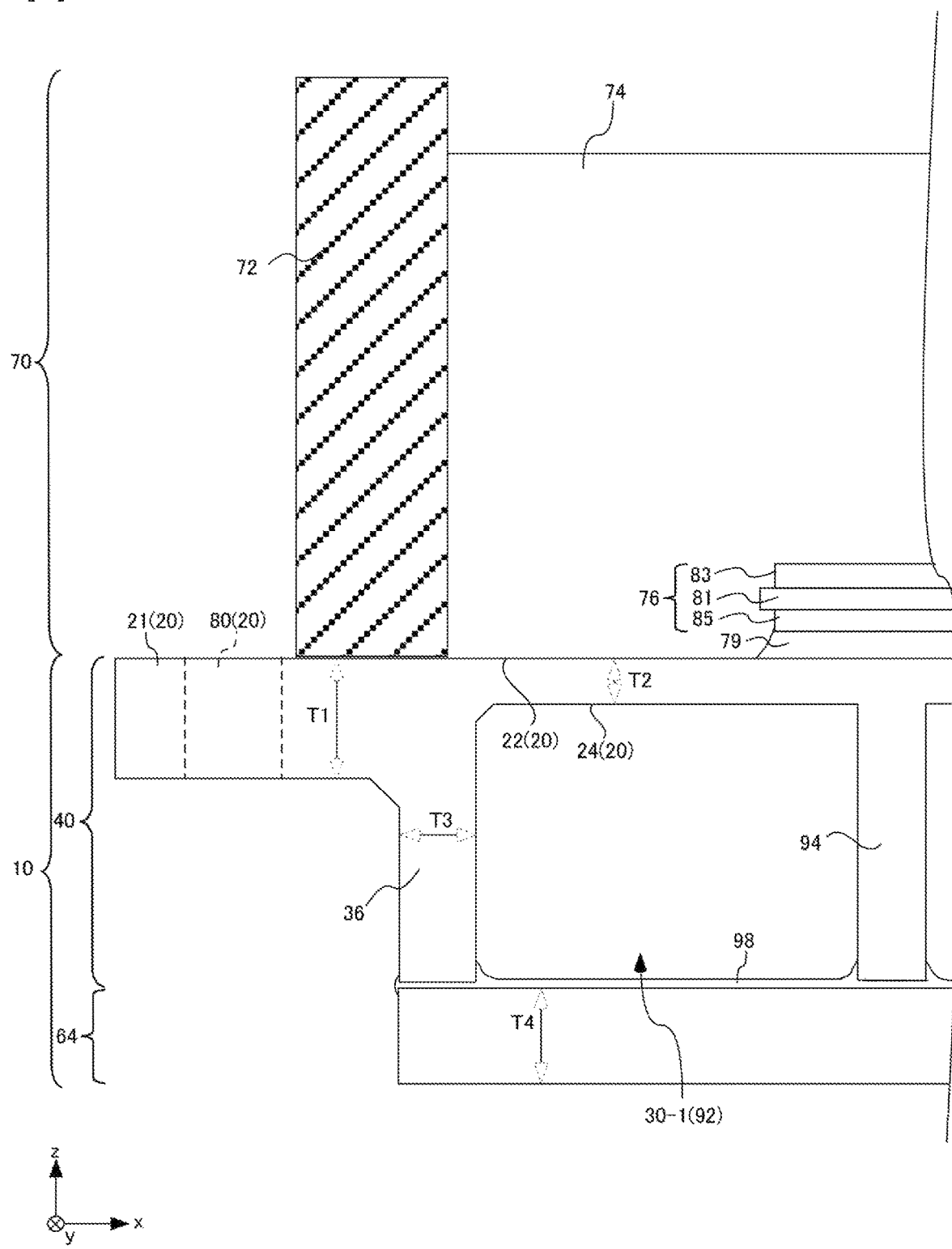
FIG. 4 is a partially enlarged view of a region [A] illustrated with a broken line in FIG. 3.
Figure 5:
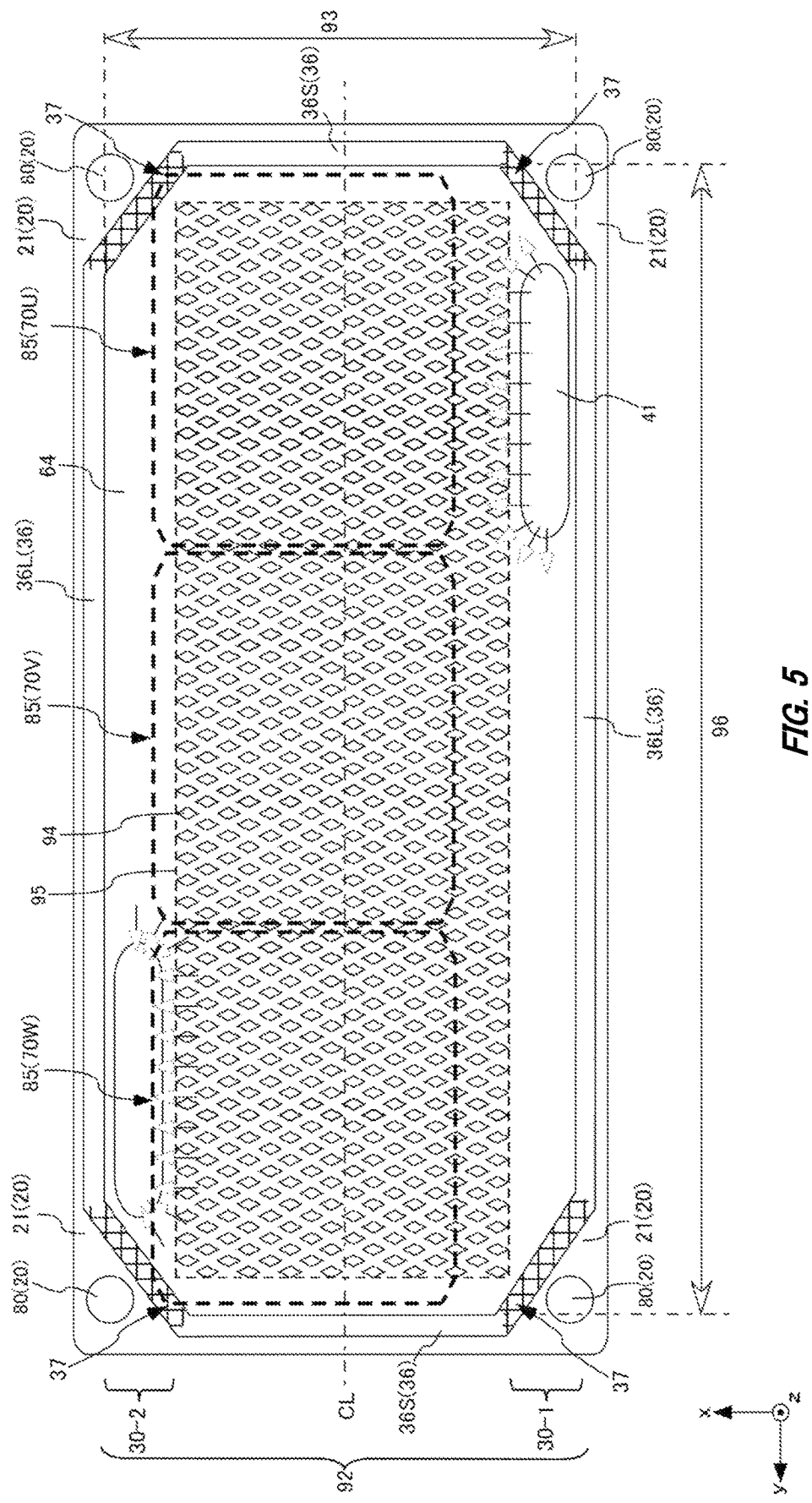
FIG. 5 is a diagram illustrating an example of an arrangement of a fin region 95 of the cooling device 10, an arrangement of a metal layer 85 of a semiconductor device 70, a shape of a cooling pin fin 94, and a flow direction of a refrigerant in the semiconductor module 100 according to an embodiment of the invention.

FIG. 1 is a schematic perspective view illustrating an example of a semiconductor module 100 according to an embodiment of the invention, and FIG. 2 is a schematic perspective view illustrating an example of a cooling device 10 of the semiconductor module 100. In addition, FIG. 3 is a schematic cross-sectional view illustrating an example of the semiconductor module 100 according to an embodiment of the invention, and FIG. 4 is a partially enlarged view of a region A in FIG. 3. In addition, FIG. 5 is a diagram illustrating an example of an arrangement of a fin region 95 of the cooling device 10, an arrangement of a metal layer 85 of a semiconductor device 70, a shape of a cooling pin fin 94, and a flow direction of a refrigerant in the semiconductor module 100 according to an embodiment of the invention.

In FIG. 3, a semiconductor chip 78 of a U-phase unit 70U in the semiconductor module 100 illustrated in FIG. 1, and an outlet 42 of the cooling device 10 illustrated in FIG. 2 both are virtually cut in an xz plane. In addition, in FIG. 4, the thickness of a z axis direction of a fastening portion 21 of a top plate 20 is represented by T1, the thickness of the z axis direction in the fin region 95 of the top plate 20 is represented by T2, the thickness of an x axis direction of a side wall 36 is represented by T3, and the thickness of the z axis direction of a bottom plate 64 is represented by T4. In addition, in FIG. 5, the metal layer 85 of each of the U-phase unit 70U, a V-phase unit 70V, and a W-phase unit 70W illustrated in FIG. 1 is illustrated with a broken line.

The semiconductor module 100 includes the semiconductor device 70 and the cooling device 10. The semiconductor device 70 of this example is placed in the cooling device 10. In the explanation of this embodiment, a plane of the cooling device 10 where the semiconductor device 70 is placed is set to an xy plane, and an axis perpendicular to the xy plane is set to the z axis. The xyz axes form a right-handed system. In the explanation of this embodiment, the direction from the cooling device 10 to the semiconductor device 70 in the z axis direction is referred to as an upper direction, and the opposite direction is referred to as a lower direction, but the upper and lower directions are not limited to the gravity direction. In addition, in the explanation of this embodiment, among the surfaces of each member, the surface on the upper side is referred to as an upper surface, the surface on the lower side is referred to as a lower surface, and the surface between the upper surface and the lower surface is referred to as a side surface. In the explanation of this embodiment, a plan view means a case where the semiconductor module 100 is viewed from the positive direction of the z axis.

The semiconductor device 70 includes the semiconductor chip 78, and a circuit board 76 where the semiconductor chip 78 is mounted. The semiconductor device 70 of this example may include three circuit boards 76, or two semiconductor chips 78 may be mounted in each circuit board 76. As illustrated in FIG. 1, the semiconductor device 70 of this example is a power semiconductor device, and may include the U-phase unit 70U which includes the circuit board 76, a semiconductor chip 78-1, and a semiconductor chip 78-4, the V-phase unit 70V which includes the circuit board 76, a semiconductor chip 78-2, and a semiconductor chip 78-5, and the W-phase unit 70W which includes the circuit board 76, a semiconductor chip 78-3, and a semiconductor chip 78-6. The semiconductor module 100 of this example may function as a device which forms a three-phase AC inverter. Further, the semiconductor chip 78 of each of the U-phase unit 70U, the V-phase unit 70V, and the W-phase unit 70W is a heating source which generates heat in a case where the semiconductor module 100 operates.

The semiconductor chip 78 is a vertical semiconductor element, and includes an upper electrode and a lower electrode. The semiconductor chip 78 includes, as an example, elements such as an insulated gate bipolar transistor (IGBT), a MOS field effect transistor (MOSFET), and a freewheel diode (FWD) which are formed in a semiconductor board such as silicon. The semiconductor chip 78 may be a reverse conduction IGBT (RC-IGBT) in which the IGBT and the FWD are formed in one semiconductor board. In the RC-IGBT, the IGBT and the FWD may be connected in reverse parallel.

The lower electrode of the semiconductor chip 78 is connected to the upper surface of the circuit board 76. The semiconductor chip 78 of this example may be fixed to the upper surface of the circuit board 76 by a solder 79. The upper electrode of the semiconductor chip 78 may be an emitter, source, or anode electrode, and the lower electrode may be a collector, drain, or cathode electrode. The semiconductor board in the semiconductor chip 78 may be made of silicon carbide (SiC) or gallium nitride (GaN).

The semiconductor chip 78 which includes a switching element such as an IGBT or a MOSFET includes a control electrode. The semiconductor module 100 may include a control terminal which is connected to the control electrode of the semiconductor chip 78. The switching element may be controlled by an external control circuit via the control terminal.

As illustrated in FIGS. 3 and 4, the circuit board 76 is a substantially rectangular laminated circuit board which includes sequentially an insulating plate 81 which includes the upper surface and the lower surface, a circuit layer 83 provided in the upper surface of the insulating plate 81, and the metal layer 85 provided in the lower surface of the insulating plate 81. The circuit board 76 includes the upper surface and the lower surface. The lower surface is disposed in the upper surface of the cooling device 10. The circuit board 76 is fixed to the upper surface of the cooling device 10 by the solder 79 via the metal layer 85. In addition, as an example, two semiconductor chips 78 are fixed on the upper surface side of the circuit board 76 via the circuit layer 83. Further, in the specification of the present application, the substantially rectangular shape may mean a substantially square shape or a substantially oblong shape, or may be a shape of which at least one corner is chamfered or smoothened. For example, the substantially rectangular shape may include an 8-angled shape, a 12-angled shape, or a 16-angled shape of which four corners each are chamfered.

The circuit board 76 may be, for example, a DCB (Direct Copper Bonding) board or an AMB (Active Metal Brazing) board. The insulating plate 81 may be formed using a ceramic material such as alumina ($Al_2O_3$), aluminum nitride (AlN), silicon nitride ($Si_3N_4$), or the like. The circuit layer 83 and the metal layer 85 may be a plate material containing a conductive material such as copper or a copper alloy. The circuit layer 83 is fixed on the upper surface side of the insulating plate 81 by a solder or a bra zing material. In the upper surface of the circuit layer 83, the semiconductor chip 78 is electrically and mechanically connected by a solder or the like, that is, directly connected in an electric circuit manner. Further, the circuit layer 83 may be electrically connected to another conductive member by a wire or the like.

The cooling device 10 includes a base plate 40 and the bottom plate 64. The base plate 40 includes the top plate 20 where the semiconductor device 70 is mounted, the side wall 36 which is connected to the top plate 20, and a plurality of cooling pin fins 94 which are connected to the top plate 20.

The top plate 20 is a plate-shaped member having a main surface expanding in the xy plane. The top plate 20 of this example is a substantially oblong shape which has a long side and a short side in a plan view. In addition, in the top plate 20 of this example, the short side is parallel to the x axis, and the long side is parallel to the y axis. The top plate 20 includes the fastening portion 21 for fastening to an external device where the semiconductor module 100 is mounted. The fastening portion 21 is located on the outer side from the side wall 36 which is connected to the top plate 20 in a plan view, and includes a through hole 80 through which a boss of the external device is inserted. The fastening portion 21 of this example includes four through holes 80 in total, one at each of the four corners of the substantially oblong top plate 20.

As illustrated in FIG. 3, the top plate 20 includes an upper surface (front surface) 22 parallel to the xy plane and a lower surface (rear surface) 24. As an example, the top plate 20 is formed of metal and, as a more specific example, is formed of metal containing aluminum. The top plate 20 may be formed with a layer of which the surface is plated with nickel. In the upper surface 22 of the top plate 20, the semiconductor device 70 is placed. In this case, in the upper surface 22 of the top plate 20, the circuit board 76 of the semiconductor device 70 may be directly fixed by the solder 79. In the top plate 20, heat generated in each semiconductor chip 78 is transferred. The top plate 20, the circuit board 76, and the semiconductor chip 78 are sequentially disposed facing the positive direction of the z axis. The top plate 20 and the circuit board 76, and the circuit board 76 and the semiconductor chip 78 may be thermally connected therebetween. In this example, the respective members are fixed by the solder 79, and the respective members are thermally connected via the solder 79.

Here, as illustrated in FIG. 3, the above-mentioned semiconductor device 70 may additionally include a receiving portion 72. The receiving portion 72 is, for example, a frame body formed of an insulating material such as a thermosetting resin or an ultraviolet curing resin, and may be provided to surround a region where the circuit board 76 and the like are disposed in the upper surface 22 of the top plate 20. The receiving portion 72 may be bonded to the upper surface 22 of the top plate 20. The receiving portion 72 includes an inner space where the semiconductor chip 78, the circuit board 76, and the other circuit elements can be stored. The receiving portion 72 may store the respective components including the circuit board 76 of the semiconductor device 70 and the semiconductor chip 78 in the inner space. The inner space of the receiving portion 72 may be filled with a sealing portion 74 to seal the semiconductor chip 78, the circuit board 76, and the other circuit elements. The sealing portion 74 is an insulating member containing, for example, silicone gel or a resin such as epoxy resin. Further, in FIG. 1, the receiving portion 72 and the sealing portion 74 are not illustrated for the purpose of simplifying the description.

The side wall 36 has a substantially constant thickness, and forms the side surface of the cooling device 10. The side wall 36 of this example has a substantially rectangular contour which has a long side and a short side in the xy plane. Since the side wall 36 forms the side surface of the cooling device 10, the short side of the contour of the side wall 36 is parallel to the x axis, and the long side is parallel to the y axis in a plan view. In addition, the side wall 36 of this example is located on the inner side from the fastening portion 21 of the top plate 20 in a plan view, and extends in the negative direction of the z axis from the top plate 20. Further, the contour may refer to a line formed along the appearance of an object.

The side wall 36 may include a set of side wall elements 36L, each of which extends in the y axis direction and faces each other, and a set of side wall elements 36S, each of which extends in the x axis direction and faces each other. The thickness of the side wall 36 may be, for example, 1 mm or more and 3 mm or less. An extending direction of the side wall element 36L and an extending direction of the side wall element 36S are substantially orthogonal to each other in a range of 85 to 95 degrees in a plan view, and preferably intersect each other at 90 degrees. The length of the side wall element 36S may be shorter than the length of the side wall element 36L. The side wall element 36L may be straight, and may include a curved line in a plan view.

In a plan view, the side wall 36 includes a slope portion 37 which is inclined inward to form an angle with respect to each of the y axis direction and the x axis direction at least at one corner. For example, the side wall 36 may include the slope portion 37 which connects the end portion of the side wall element 36S and the end portion of the side wall element 36L. In FIG. 5, the slope portion 37 is illustrated as a mesh region. The same applies also in the subsequent drawings.

The slope portion 37 may be provided to connect the end portion of the side wall element 36L and the end portion of the side wall element 36S. In a plan view, the extending direction of the slope portion 37 and the y axis direction may intersect, for example, at an angle (narrow angle) of 30 degrees or more and 60 degrees or less as illustrated by the angle θ in FIG. 6 described later. The angle θ illustrated in FIG. 6 may be preferably 40 degrees or more and 50 degrees or less. In a plan view, the shape of the side wall 36 may be a polygon, for example, an n-angled shape (n is an integer of 5 or more), and preferably a 6-angled shape or an 8-angled shape.

In a plan view, the side wall 36 may include two slope portions 37 at least at two corners. As illustrated in FIG. 5, the side wall 36 of this example includes the slope portion 37 in each of four corners. Further, in a plan view, the corner of the side wall 36 may indicate a region where the short side extending in the x axis direction of the side wall 36 and the long side extending in the y axis direction intersect. In addition, in a plan view, the inner side of the side wall 36 may indicate a side of a region surrounded by the side wall 36 which has a substantially rectangular contour.

In FIG. 5, a center line CL is illustrated which extends in the y axis direction through the center of the x axis direction of the side wall 36. As illustrated in FIG. 5, in a plan view, the metal layer 85 of each circuit board 76, that is, each circuit board 76, may be disposed to be shifted in the x axis direction with respect to the center line CL. In this case, the length of one side on the inner side of the side wall 36 in the x axis direction may be approximately the same as the length of one side of the metal layer 85 of the circuit board 76, or may be longer than the length of one side of the metal layer 85. As illustrated in FIG. 5, the side wall 36 of this example may be configured so that the length on the inner side of two sides extending in the x axis direction is the same as the length of two sides extending in the x axis direction of the metal layer 85 of each circuit board 76. For example, the length of the side wall element 36S may be the same as the length of one side in the x axis direction of the metal layer 85.

Alternatively, for example, in a case where the center of the x axis direction of each circuit board 76 is disposed to be located on the center line CL, the length of one side on the inner side of the side wall 36 in the x axis direction may be shorter than the length of one side of the metal layer 85 of the circuit board 76. For example, as illustrated in FIG. 7 describing a metal layer 86 in a modification of the metal layer 85, the length of the side wall element 36S in the semiconductor module 100 according to an embodiment of the invention may be shorter than the length of one side in the x axis direction of the metal layer 86. The aspect ratio of the metal layer 86 illustrated in FIG. 7 is different from the aspect ratio of the metal layer 85, and the length of a side in the x axis direction is relatively long. Further, in FIG. 7, only the side wall 36 in the semiconductor module 100, and the metal layer 85 of each of the U-phase unit 70U, the V-phase unit 70V, and the W-phase unit 70W are illustrated. The same applies also in FIGS. 6, and 8 to 11 described later.

In a plan view, at least one corner of the metal layer 85 of the circuit board 76 is at least partially overlapped with the slope portion 37 of the side wall 36. For example, in a plan view, the metal layer 85 is a substantially rectangular shape, and the corner of the metal layer 85 may be partially overlapped with the slope portion 37. As illustrated in FIG. 5, in this example, among the U-phase unit 70U, the V-phase unit 70V, and the W-phase unit 70W, only the metal layer 85 of the circuit board 76 of each of the U-phase unit 70U and the W-phase unit 70W located at both ends in the y axis direction may be partially overlapped with the slope portion 37 of the side wall 36.

In this example, only one corner among four corners of the metal layer 85 of the circuit board 76 of each of the U-phase unit 70U and the W-phase unit 70W may be partially overlapped with the slope portion 37 of the side wall 36. More specifically, one corner located on the negative direction side of the y axis and on the positive direction side of the x axis of the metal layer 85 of the U-phase unit 70U located on the most negative direction side of the y axis among three units may be partially overlapped with one slope portion 37 located on the negative direction side of the y axis and on the positive direction side of the x axis of the side wall 36. In addition, likewise, one corner located on the positive direction side on the y axis and the positive direction side of the x axis of the metal layer 85 of the W-phase unit 70W located on the most positive direction side of the y axis among three units may be partially overlapped with one slope portion 37 located on the positive direction side of the y axis and the positive direction side of the x axis of the side wall 36.

Alternatively, preferably, two corners of the metal layer 85 of the circuit board 76 may be at least partially overlapped with two slope portions 37 of the side wall 36 in a plan view. More specifically, each of two corners located on the negative direction side of the y axis of the metal layer 85 of the U-phase unit 70U located on the most negative direction side of the y axis among three units may be partially overlapped with each of two slope portions 37 located on the negative direction side of the y axis of the side wall 36. In addition, likewise, each of two corners located on the positive direction side of the y axis of the metal layer 85 of the W-phase unit 70W located on the most positive direction side of the y axis among three units may be partially overlapped with each of two slope portions 37 located on the positive direction side of the y axis of the side wall 36.

The metal layer 85 is a substantially rectangular shape in a plan view as described above, and may include a set of sides extending in the x axis direction and a set of sides extending in the y axis direction. The metal layer 85 may have a plurality of angles provided by chamfering in the corners.

In a plan view, the contour of at least one corner of the metal layer 85 of the circuit board 76 may be located between the inner side and the outer side of the slope portion 37 of the side wall 36. As illustrated in FIG. 5, in this example, each of two corners located on the negative direction side of the y axis of the metal layer 85 of the U-phase unit 70U may be located between the inner side and the outer side of each of two slope portions 37 located on the negative direction side of the y axis of the side wall 36 in a plan view. In addition, likewise, each of two corners located on the positive direction side of the y axis of the metal layer 85 of the W-phase unit 70W may be located between the inner side and the outer side of each of two slope portions 37 located on the positive direction side of the y axis of the side wall 36.

In addition, portions other than the corners of the metal layer 85 of the circuit board 76 may be not overlapped with the side wall 36 in a plan view. As illustrated in FIG. 5, in this example, portions other than two corners located on the negative direction side of the y axis of the metal layer 85 of the U-phase unit 70U may be not overlapped with the side wall 36 in a plan view. In addition, likewise, portions other than two corners located on the positive direction side of the y axis of the metal layer 85 of the W-phase unit 70W may be not overlapped with the side wall 36.

At least one of the plurality of cooling pin fins 94 has a substantially rhombic cross-sectional shape in the xy plane. In the subsequent description, one or the plurality of cooling pin fins 94 may be call simply the cooling pin fin 94. The cooling pin fin 94 extends from the top plate 20 in the negative direction of the z axis. The cooling pin fin 94 is located on the inner side from the side wall 36 in a plan view, and surrounded by the side wall 36.

In the cooling device 10 of FIG. 2, the fin region 95 where the cooling pin fin 94 is provided is illustrated with dots instead of illustrating the cooling pin fin 94 for simplicity. The fin region 95 may be a rectangular shape in a plan view, and the short side may be parallel to the x axis and the long side may be parallel to the y axis.

In the base plate 40, the top plate 20, the side wall 36, and the cooling pin fin 94 may be integrally configured. In this example, the top plate 20, the side wall 36, and the cooling pin fin 94 may be integrally formed. For example, the top plate 20, the side wall 36, and the cooling pin fin 94 may be integrally formed from one continuous plate member. For example, the top plate 20, the side wall 36, and the cooling pin fin 94 may be integrally formed by performing a punching on one continuous plate member using a mold corresponding to the shapes of the top plate 20, the side wall 36, and the cooling pin fin 94. As another example, the top plate 20, the side wall 36, and the cooling pin fin 94 may be integrally formed by casting using any forging method such as cold forging under an ambient temperature environment using an impact press, warm forging under a high temperature environment, hot forging, or molten metal forging, or by casting using molding. The semiconductor module 100 of this embodiment can reduce the number of components by integrally forming the top plate 20, the side wall 36, and the cooling pin fin 94 compared to the forming by fixing the individually-formed components to each other.

The bottom plate 64 is a plate-shaped member. The bottom plate 64 of this example is a substantially oblong shape which has a long side and a short side in a plan view. In addition, in the bottom plate 64 of this example, the short side is parallel to the x axis direction, and the long side is parallel to the y axis direction. The bottom plate 64 forms the bottom surface of a refrigerant circulating portion 92. The bottom plate 64 is connected to the side wall 36, and faces the top plate 20.

The refrigerant circulating portion 92 for circulating the refrigerant is defined by the top plate 20, the side wall 36, and the bottom plate 64. In other words, the side wall 36 is disposed to surround the refrigerant circulating portion 92 in the xy plane. The top plate 20 and the bottom plate 64 interpose the refrigerant circulating portion 92 in the z axis direction, and are disposed to face each other. Therefore, the contour of the refrigerant circulating portion 92 in the xy plane is defined by the inner periphery of the side wall 36. Therefore, as illustrated in FIG. 5, the refrigerant circulating portion 92 is a substantially rectangular shape in which the cross section parallel to the main surface of the top plate 20 has a long side 96 and a short side 93. Further, in this example, the direction of the long side 96 is the y axis direction, and the direction of the short side 93 is the x axis direction.

In addition, in the bottom plate 64 of this example, there are formed an inlet 41 which is a through hole for introducing the refrigerant to the refrigerant circulating portion 92, and the outlet 42 which is a through hole for leading the refrigerant from the refrigerant circulating portion 92.

The inlet 41 and the outlet 42 each can be connected to a pipe communicating to an external refrigerant supply source. In other words, the cooling device 10 can be connected to the external refrigerant supply source by two pipes. Therefore, the cooling device 10 is configured to carry in the refrigerant from one pipe via the inlet 41. The refrigerant can be carried out to the other pipe via the outlet 42 after circulating the inside of the refrigerant circulating portion 92.

The inlet 41 and the outlet 42 are located on one side of the cooling device 10 in the x axis direction and the other side opposite to the one side, and are located one side of the cooling device 10 in the y axis direction and the other side opposite to the one side. In other words, the inlet 41 and the outlet 42 are located at both ends facing the refrigerant circulating portion 92 in a diagonal direction of the refrigerant circulating portion 92 which has a substantially rectangular shape in the xy plane.

The semiconductor module 100 of this embodiment causes heat generated from the respective semiconductor chips 78 arranged in the z axis direction in the upper surface of the cooling device 10 to flow into the refrigerant circulating portion 92 via the inlet 41 of the cooling device 10, disperses the heat over the refrigerant circulating portion 92, and efficiently performs the cooling by the refrigerant flowing out via the outlet 42.

In the above-mentioned refrigerant circulating portion 92, the refrigerant such as LLC or water is circulated. In the refrigerant circulating portion 92, the refrigerant is introduced from the inlet 41 which communicates with one side in the direction of the short side 93, and is led from the outlet 42 which communicates with the other side in the direction of the short side 93. The refrigerant comes into contact with the lower surface 24 of the top plate 20 where the circuit board 76 is disposed and the cooling pin fin 94, and cools down the semiconductor device 70.

The refrigerant circulating portion 92 may be a closed space which abuts on each of the top plate 20, the side wall 36, and the bottom plate 64. The bottom plate 64 is disposed directly or indirectly in close contact with the lower end of the negative direction of the z axis of the side wall 36. The refrigerant circulating portion 92 is sealed by the top plate 20, the side wall 36, and the bottom plate 64. Further, the indirectly close contact indicates a state where the lower end of the side wall 36 and the bottom plate 64 are in close contact via the fixing agent 98, which is provided between the lower end of the side wall 36 and the bottom plate 64 and is a sealing material, an adhesive, a brazing material, or other members provided between the lower end of the side wall 36 and the bottom plate 64. The close contact indicates a state where the refrigerant in the refrigerant circulating portion 92 does not leaked out from the closed contact portion. The lower end of the side wall 36 and the bottom plate 64 are preferably brazed. Further, the base plate 40 and the bottom plate 64 may be formed of the same metal composition, the brazing material may be formed of metal having a melting point lower than that of the base plate 40, for example, metal containing aluminum.

The cooling pin fin 94 is disposed in the refrigerant circulating portion 92, and extends between the top plate 20 and the bottom plate 64. The cooling pin fin 94 of this example extends in the z axis direction to be substantially orthogonal to the main surface of each of the top plate 20 and the bottom plate 64. The cooling pin fin 94 of this example is disposed in a predetermined pattern in the xy plane as illustrated in FIG. 4, and extends in the z axis direction to be substantially orthogonal to the main surface of each of the top plate 20 and the bottom plate 64. In addition, the cooling pin fin 94 of this example has a rhombic shape which is longer in the direction of the short side 93 than in the direction of the long side 96 of the refrigerant circulating portion 92 in the cross section of the xy plane. In a pair of diagonal lines of the rhombic shape, the diagonal line parallel to the long side 96 is shorter than the diagonal line parallel to the short side 93.

The cooling pin fin 94 includes the upper end and the lower end which face each other in the z axis direction. The upper end is thermally and mechanically connected to the lower surface 24 of the top plate 20, and extends from the lower surface 24 of the top plate 20 toward the refrigerant circulating portion 92. In a case where the cooling pin fin 94 is integrally formed with the top plate 20, the upper end of the cooling pin fin 94 integrally protrudes from the lower surface 24 of the top plate 20, and extends from the lower surface 24 of the top plate 20 toward the refrigerant circulating portion 92. The lower end of the cooling pin fin 94 of this example is fixed to the bottom plate 64 by the fixing agent 98. The lower end of the cooling pin fin 94 may be separated from the bottom plate 64. If there is a gap between the cooling pin fin 94 and the bottom plate 64, stress is unlikely to occur between the cooling pin fin 94 and the bottom plate 64 even when a crook is generated in the bottom plate 64. The heat generated by each semiconductor chip 78 moves to the refrigerant which passes near the cooling pin fin 94. With this configuration, each semiconductor chip 78 is cooled down.

As illustrated with a broken line in FIG. 5, the fin region 95 of the refrigerant circulating portion 92 has a substantially oblong shape in which the cooling pin fins 94 are arranged more in the direction of the long side 96 of the refrigerant circulating portion 92 than in the direction of the short side 93, and the length in the direction of the long side 96 is longer than that in the direction of the short side 93. The cooling pin fins 94 may be arranged more, in a unit length, in the direction of the long side 96 of the refrigerant circulating portion 92 than in the direction of the short side 93. As an example, in the fin region 95, a ratio of the number of cooling pin fins 94 arranged in the direction of the long side 96 of the refrigerant circulating portion 92 and the number of cooling pin fins 94 arranged in the direction of the short side 93 of the refrigerant circulating portion 92 may fall within a predetermined range. The fin region 95 includes a region where the cooling pin fin 94 is provided, and a flow path between the cooling pin fins 94. In addition, as illustrated in the drawing, the cooling pin fins 94 in the fin region 95 of this example are arranged in a staggered pattern, and instead of this, may be arranged in a square pattern. Further, a gap between the adjacent cooling pin fins 94 may be narrower than the width of the cooling pin fin 94 itself.

Further, as illustrated in FIG. 5, all of the metal layers 85 of the U-phase unit 70U, the V-phase unit 70V, and the W-phase unit 70W of this example are arranged partially on the outer side of the fin region 95 in a plan view.

In addition, the refrigerant circulating portion 92 includes a first refrigerant passage 30-1 and a second refrigerant passage 30-2 which are disposed to interpose the fin region 95 in a plan view. A refrigerant passage 30 indicates a space having a height equal to or more than a predetermined height (the length in the z axis direction) in the refrigerant circulating portion 92. The height equal to or more than a predetermined height may be a distance between the top plate 20 and the bottom plate 64.

The first refrigerant passage 30-1 is located on one side in the direction of the short side 93 rather than the fin region 95 and communicates with the inlet 41, and extends in the direction of the long side 96. The second refrigerant passage 30-2 is located on the other side in the direction of the short side 93 rather than the fin region 95 and communicates with the outlet 42, and extends in the direction of the long side 96. The extending directions of the first refrigerant passage 30-1 and the second refrigerant passage 30-2 also refer to as the direction of the long side 96 of the fin region 95. Further, the first refrigerant passage 30-1 is an example of one communication region, and the second refrigerant passage 30-2 is an example of the other communication region.

As described above, in the semiconductor device 70 of the semiconductor module 100, in a case where there are heating sources such as the plurality of semiconductor chips 78 in the y axis direction, the respective heating sources cannot be cooled down uniformly if a main flow direction of the refrigerant flowing to the cooling device 10 is parallel to the arrangement direction of the heating sources (the y axis direction). Therefore, as in the semiconductor module 100 of this embodiment, it is considered that the main flow direction (the positive direction of the x axis) of the refrigerant flowing to the cooling device 10 is disposed to be orthogonal to the arrangement direction (the y axis direction) of the plurality of heating sources. More specifically, according to the semiconductor module 100 of this embodiment, the cross section of the refrigerant circulating portion 92 parallel (in the xy plane) to the main surface of the top plate 20 is a substantially rectangular shape having the long side 96 and the short side 93. The refrigerant is introduced from the inlet 41 communicating to one side in the direction (the x axis direction) of the short side 93 to be led from the outlet 42 communicating to the other side in the direction (the x axis direction) of the short side 93.

In the cooling device 10, the cooling pin fin 94 is disposed to efficiently radiate heat transferred from the plurality of heating sources to the refrigerant flowing in the refrigerant circulating portion 92. In the cooling device 10, in a case where there is used a pin fin having a circular shape of the cross section parallel (in the xy plane) to the main surface of the top plate 20, the surface area of the pin fin in contact with the refrigerant is small. Therefore, the heat radiation efficiency becomes low compared to a case where there is used a pin fin having a polygonal shape of the cross section parallel (in the xy plane) to the main surface of the top plate 20. Further, even in a case where there is used a pin fin having a polygonal shape of the cross section (in the xy plane) parallel to the main surface of the top plate 20, if there is used a cross-sectional shape, such as a square shape or a six-angled shape, where the width of the main flow direction of the refrigerant in the xy plane and the width in the direction orthogonal to the corresponding flow direction are equal, or a cross-sectional shape such as an oblong shape where the width of the orthogonal direction is longer than the width of the flow direction, the area in the plane orthogonal to the flow direction is large, a flow velocity loss of the refrigerant becomes large, and the heat radiation efficiency becomes low. With this regard, according to the semiconductor module 100 of this embodiment, the cooling pin fin 94 disposed in the refrigerant circulating portion 92 has a rhombic shape in which the length in the direction of the short side 93 is longer than that in the direction of the long side 96 of the refrigerant circulating portion 92 in the cross section of the xy plane. Therefore, the area of the plane orthogonal to the main flow direction of the refrigerant is small compared to a case where the polygonal pin fin is used, and the flow velocity loss of the refrigerant is small. Further, the cooling pin fin 94 may be a pin fin of which the cross section parallel to the main surface of the above-mentioned top plate 20 is circular or polygonal.

Here, as illustrated in FIG. 4, the thickness of the cross section of the top plate 20 in the plane (the xz plane and the yz plane) orthogonal to the direction in a plan view may be thicker in the outer side than that in the inner side of the side wall 36. In the cooling device 10 of this example, the thickness T1 of the fastening portion 21 may be thicker than the thickness T2 of the fin region 95 in the top plate 20. Since the thickness of the fin region 95 in the top plate 20 is thin, the heat from the semiconductor device 70 disposed in the upper surface 22 of the top plate 20 can be efficiently moved to the refrigerant flowing in the refrigerant circulating portion 92. On the other hand, since the strength of the fastening portion 21 is increased, it is possible to suppress the fastening portion 21 from being damaged due to a strong fastening force to be applied in a case where the semiconductor module 100 is strongly engaged with the external device by a bolt or the like.

In addition, the thickness T3 of the side wall 36 may be thicker than the thickness T2 of the fin region 95 in the top plate 20. Since the thickness of the fin region 95 in the top plate 20 is thin, the cooling efficiency can be increased as described above. On the other hand, since the strength of the side wall 36 connected to the top plate 20 is increased, it is possible to suppress that a deformation such as twisting occurs in the fin region 95 in the top plate 20 due to a mechanical or thermal influence. With this configuration, the semiconductor module 100 can suppress large stress and plastic strain from the solder 79 which fixes the semiconductor device 70 to the top plate 20.

In addition, the thickness T4 of the bottom plate 64 may be thicker than either of the thickness T3 of the side wall 36 and at least the thickness T2 of a portion defining the fin region 95 of the top plate 20. Further, the thickness T4 of the bottom plate 64 may be thicker than the thickness T1 of the fastening portion 21 of the top plate 20. As described above, the inlet 41 and the outlet 42 each are formed in the bottom plate 64. The inlet 41 and the outlet 42, which are through holes, are formed in the bottom plate 64 having the largest thickness, so that the strength of the cooling device 10 can be improved, and the machining of the cooling device 10 can be made easy. The fastening portion 21 may be integrally formed with the top plate 20 and the side wall 36 by molding, or may be formed by fixing a flange portion of the side wall 36 molded by pressing and the top plate 20.

As a result of experiments conducted to repeatedly change the external environment of the semiconductor module and the temperature due to self-heating, it has been found that the largest stress and plastic strain occur near the inner side of the corner of the side wall in a plan view in the solder interposed between the metal layer provided on the lower surface of the insulating plate and the top plate of the cooling device. It is considered that the top plate of the cooling device is easily deformed. On the other hand, the deformation of the top plate of the cooling device is locally suppressed at a place where the side wall is connected to the lower surface and the rigidity is relatively high.

According to the semiconductor module 100 of this embodiment, there are provided the cooling device 10, and the semiconductor device 70 which includes the circuit board 76 mounted in the top plate 20 of the cooling device 10. The circuit board 76 is a substantially rectangular laminated circuit board in which the insulating plate 81 including the upper surface and the lower surface, the circuit layer 83 provided in the upper surface of the insulating plate 81, and the metal layer 85 provided in the lower surface of the insulating plate 81 are sequentially included. The metal layer 85 is fixed to the upper surface 22 of the top plate 20 by the solder 79 for example. In addition, according to the cooling device 10 of the semiconductor module 100 of this embodiment, in a plan view, the side wall 36 includes the slope portion 37 at least at one corner, and at least one corner of the metal layer 85 of the circuit board 76 is partially overlapped at least with the slope portion 37 of the side wall 36.

In the semiconductor module 100, the semiconductor device 70 generates heat up to 170° C. during use. On the other hand, the refrigerant flowing in the refrigerant circulating portion 92 of the cooling device 10 maintains a room temperature to about 70° C. With this configuration, a temperature difference of 100° C. or more may occur between the semiconductor device 70 and the cooling device 10. In addition, the temperature difference may increase according to an ambient temperature where the semiconductor module 100 is placed. According to the semiconductor module 100 of this embodiment having the above configuration, for example, even in a case where there is a large difference between a linear expansion coefficient of the insulating plate 81 containing, for example, ceramic and a linear expansion coefficient of the cooling device 10 containing, for example, aluminum, it is possible to suppress large stress and plastic strain from occurring in the solder 79 interposed between the metal layer 85 provided in the lower surface of the insulating plate 81 and the top plate 20 of the cooling device 10 under a situation where the temperature is repeatedly changed by the external environment and the self-heating, and heat cycle reliability can be improved. In addition, according to the semiconductor module 100 of this embodiment, the side wall 36 of the cooling device 10 is shifted inward, so the cooling device 10 can be made compact compared to the semiconductor module in which the semiconductor device has the same dimension as that of this embodiment in a plan view, but the metal layer of the circuit board is not overlapped with the side wall.

Figure 6:
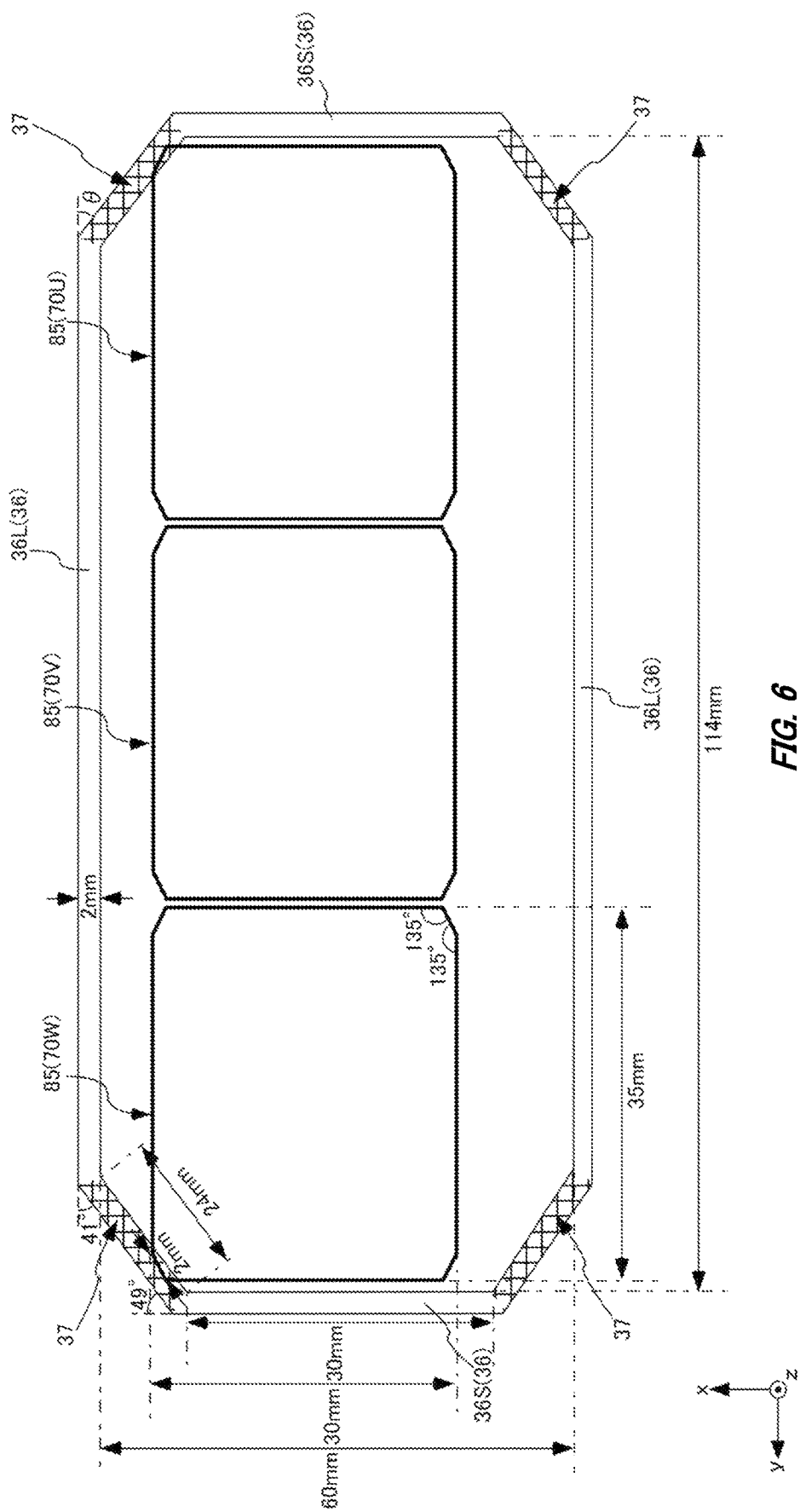
FIG. 6 is a diagram for describing a dimension of the metal layer 85 of the semiconductor device 70, a dimension of a side wall 36 of the cooling device 10, and an arrangement relation of the metal layer 85 to the side wall 36 in the semiconductor module 100 according to an embodiment of the invention.
Figure 7:
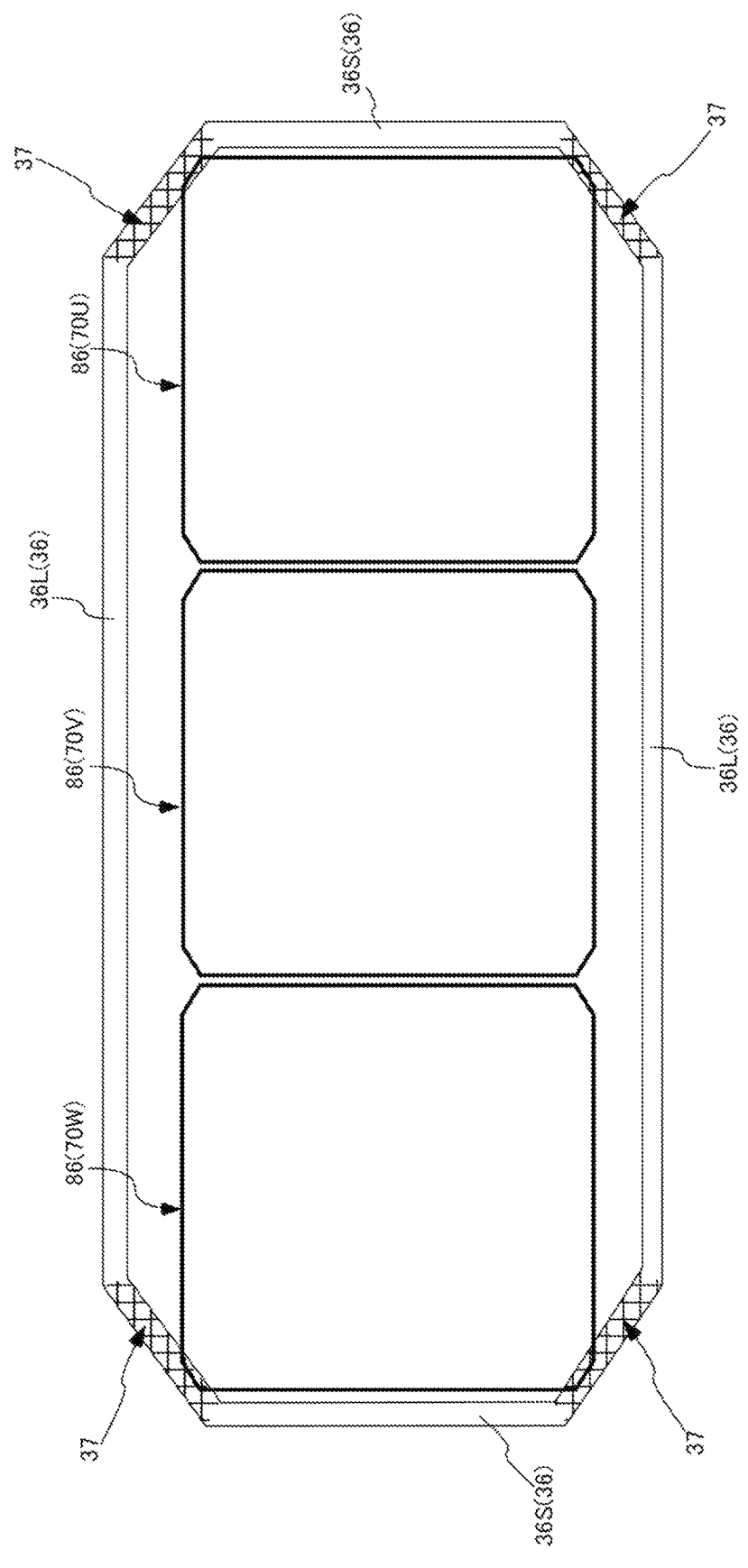
FIG. 7 is a diagram for describing a metal layer 86 which is a modification of the metal layer 85 in the semiconductor module 100 according to an embodiment of the invention.

FIG. 6 is a diagram for describing a dimension of the metal layer 85 of the semiconductor device 70, a dimension of the side wall 36 of the cooling device 10, and an arrangement relation of the metal layer 85 to the side wall 36 in the semiconductor module 100 according to an embodiment of the invention.

As illustrated in FIG. 6, the metal layer 85 according to this embodiment has an 8-angled shape in which the length in the x axis direction is 30 mm, the length in the y axis direction is 35 mm, and the interior angle of the corner is 135° in a plan view. On the other hand, the side wall 36 according to this embodiment has an 8-angled shape in which the length of one side on the inner side of the side wall 36 in the x axis direction is 30 mm, the length in the x axis direction of the side wall 36 is 60 mm, the length in the y axis direction is 114 mm, and the exterior angle of the slope portion 37 is 49° with respect to the x axis and 41° with respect to the y axis in a plan view.

Figure 8:
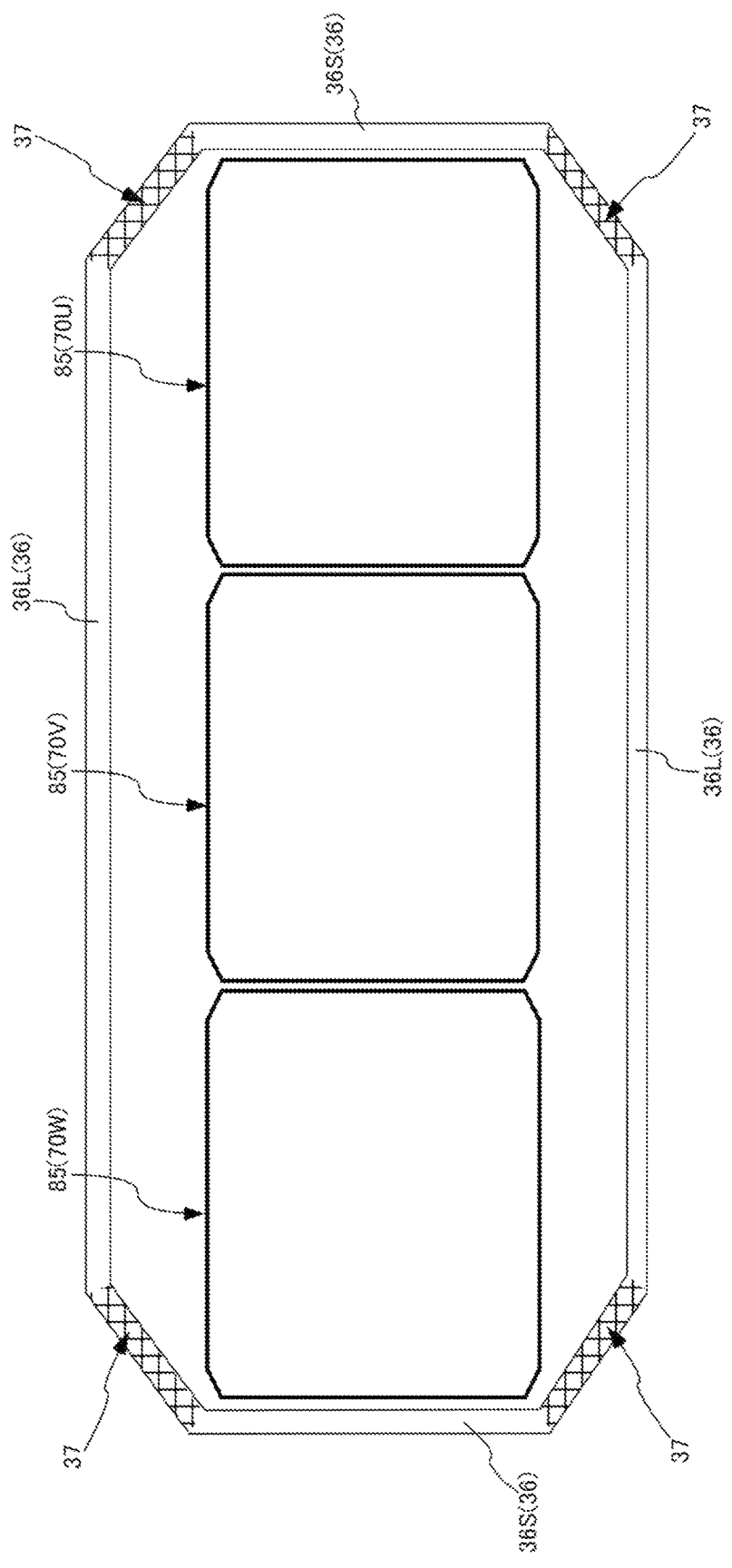
FIG. 8 is a diagram for describing a first comparison example.
Figure 9:
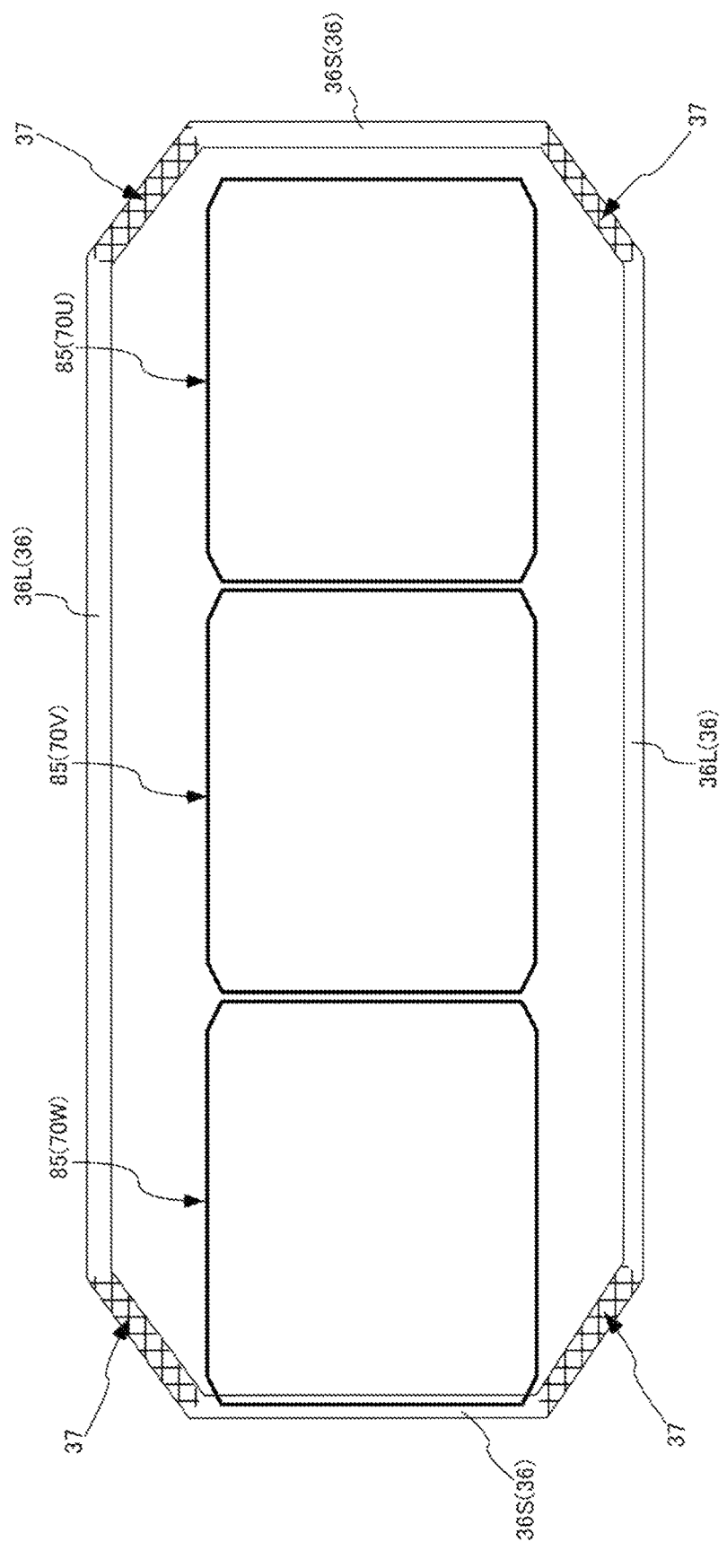
FIG. 9 is a diagram for describing a second comparison example.

FIG. 8 is a diagram for describing a first comparison example, and FIG. 9 is a diagram for describing a second comparison example. As illustrated in FIG. 8, as a first comparison example to the semiconductor module 100 according to this embodiment, a semiconductor module is prepared. The semiconductor module includes the side wall and the metal layer, which have the same dimensional shape as those of the side wall 36 and the metal layer 85 of the semiconductor module 100 according to this embodiment, but are not overlapped with each other in a plan view. In addition, as illustrated in FIG. 9, as a second comparison example to the semiconductor module 100 according to this embodiment, a semiconductor module is prepared. The semiconductor module includes the side wall and the metal layer, which have the same dimensional shape as those of the side wall 36 and the metal layer 85 of the semiconductor module 100 according to this embodiment, but are not overlapped with each other at the corners in a plan view but overlapped with each other only in one side.

As a result of simulation where the semiconductor module of each of the embodiments, the first comparison example, and the second comparison example is under a temperature cycle repeatedly changing an ambient temperature between −40° C. to 125° C., it has been confirmed that the amplitude of plastic strain is 0.21% in the first comparison example, and 0.22% in the second comparison example, while the plastic strain can be suppressed up to 0.14% according to the embodiments.

According to the semiconductor module 100 of this embodiment, it is preferable that the contour of at least one corner of the metal layer 85 is located between the inner side and the outer side of the slope portion 37 of the side wall 36 in a plan view, and the portions other than the corners of the metal layer 85 are not overlapped with the side wall 36. However, as a modification of the semiconductor module 100, even if the contour of at least one corner of the metal layer 85 is located on the outer side of the slope portion 37 of the side wall 36 in a plan view, and the portions other than the corners of the metal layer 85 are not overlapped with the side wall 36, it has been confirmed that the amplitude of plastic strain can be suppressed up to 0.16% in the above simulation.

Figure 10:
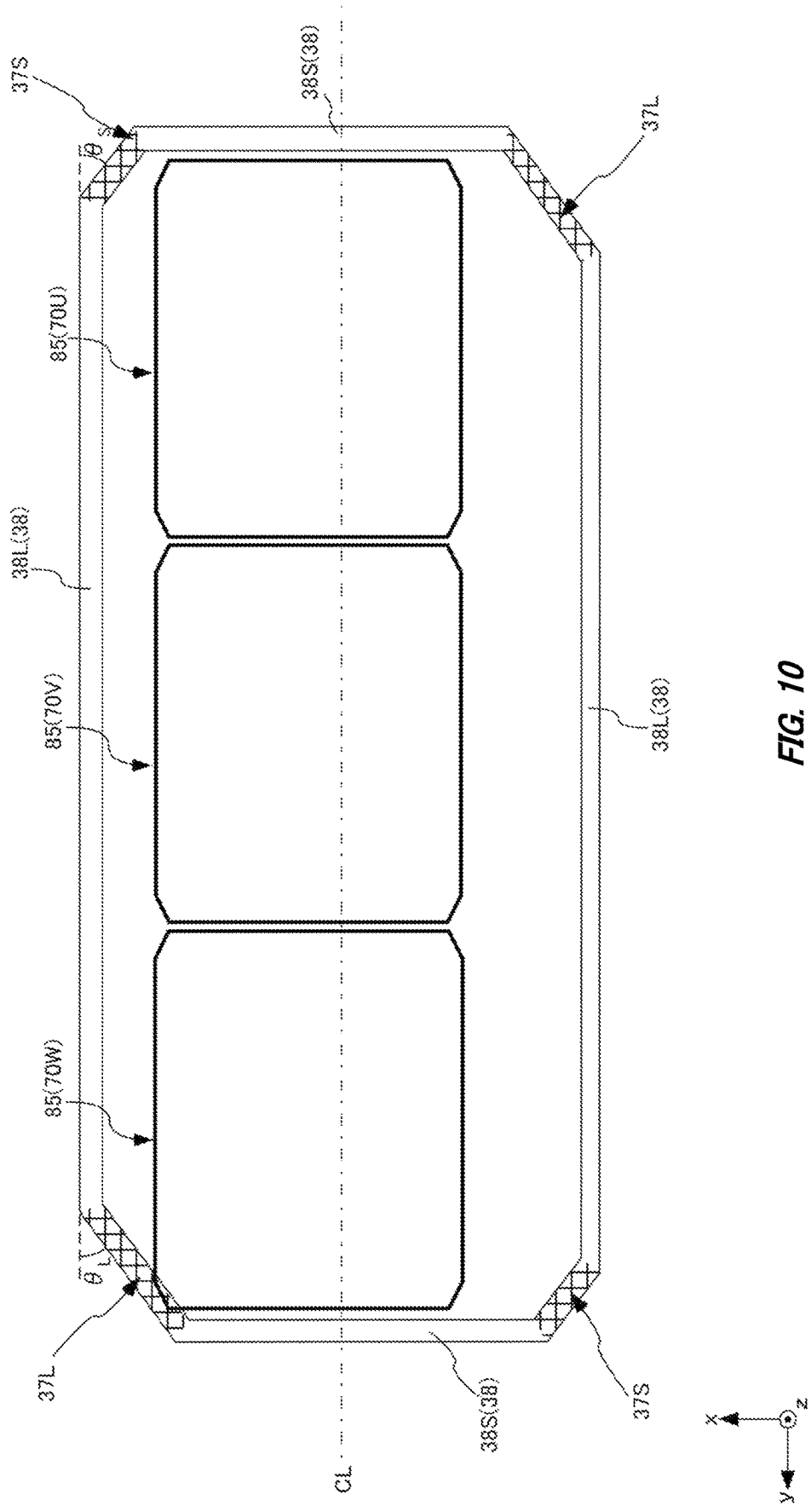
FIG. 10 is a diagram for describing a side wall 38 which is a modification of the side wall 36 in the semiconductor module 100 according to an embodiment of the invention.

FIG. 10 is a diagram for describing a side wall 38 of a modification of the side wall 36 in the semiconductor module 100 according to an embodiment of the invention. As a difference from the semiconductor module 100 according to the embodiments described using FIGS. 1 to 9, the side wall 38 includes, as illustrated in FIG. 10, a pair of slope portions 37L and 37L and a pair of slope portions 37S and 37S. Only the metal layer 85 of the circuit board 76 of the W-phase unit 70W located on the most positive direction side of the y axis among the U-phase unit 70U, the V-phase unit 70V, and the W-phase unit 70W is partially overlapped with the slope portion 37L located on the most positive direction side of the x axis of the side wall 38 and on the most positive direction side of the y axis.

As illustrated in FIG. 10, in this example, the slope portions 37L and 37L and the slope portions 37S and 37S each are provided at two sets of corners located in the diagonal direction of the refrigerant circulating portion 92 in a plan view. The lengths of the slope portion 37L and the slope portion 37S may be equal or may be different. In addition, an extending direction of the slope portion 37L and the y axis direction intersect at an angle $\theta_L$. In addition, an extending direction of the slope portion 37s and the y axis direction intersect at an angle $\theta_S$. $\theta_L$ and $\theta_S$ may be equal or may be different. Further, also in this example, the length of a side wall element 38S may be longer than the length of one side in the x direction of the metal layer 85. The semiconductor module 100 according to the modification also achieves the same effects.

Figure 11:
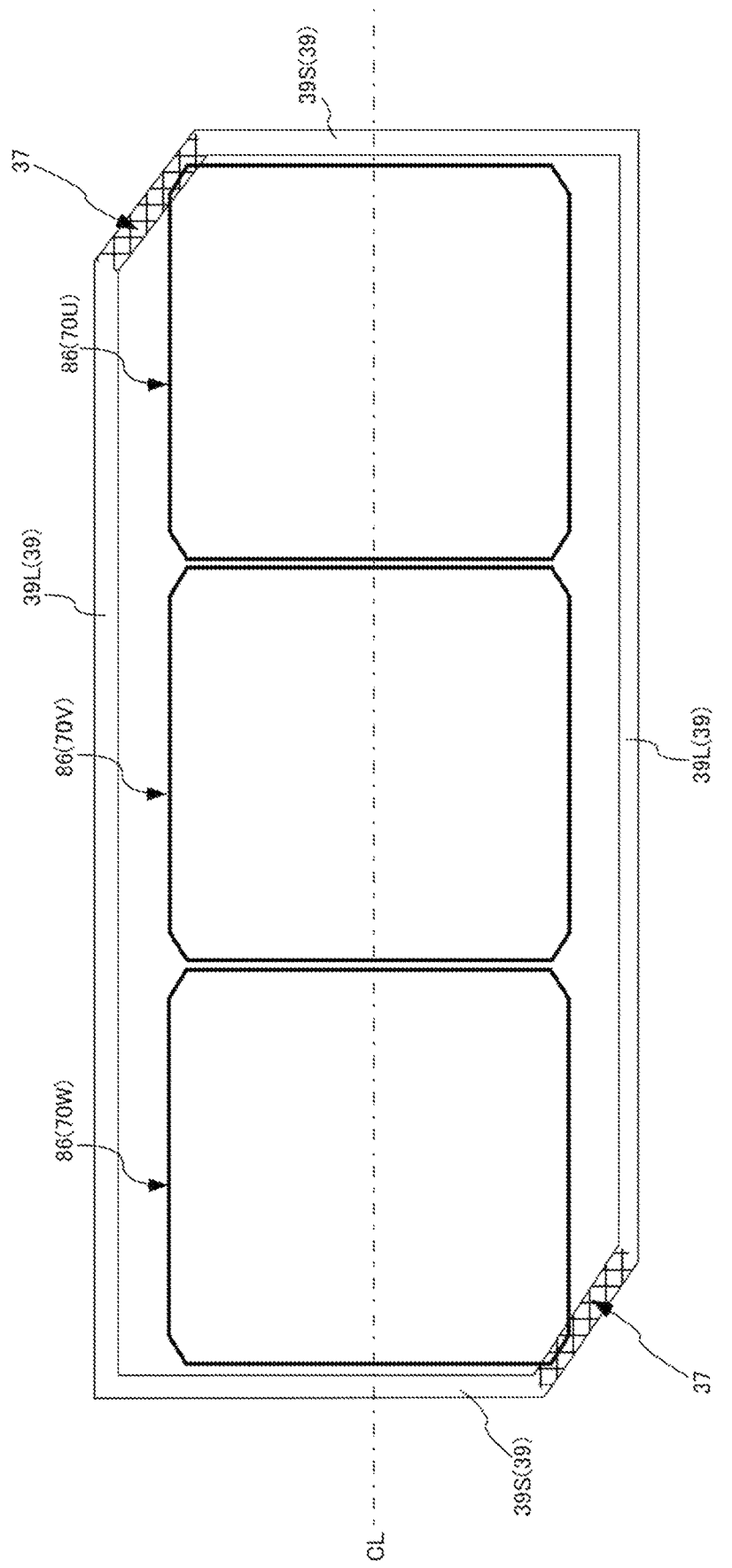
FIG. 11 is a diagram for describing a side wall 39 which is a modification of the side wall 36 in the semiconductor module 100 according to an embodiment of the invention, and the metal layer 86 which is a modification of the metal layer 85.

FIG. 11 is a diagram for describing a side wall 39 of a modification of the side wall 36 in the semiconductor module 100 according to an embodiment of the invention, and the metal layer 86 of a modification of the metal layer 85. As a difference from the semiconductor module 100 according to the embodiments described using FIGS. 1 to 9, the side wall 39 includes the slope portions 37 only at two corners located in the diagonal direction of the refrigerant circulating portion 92 in a plan view. As described above, the aspect ratio of the metal layer 86 is different from the aspect ratio of the metal layer 85, and is relatively longer than the length of the side in the x axis direction. Further, the centers of the circuit boards 76 in the x axis direction are disposed to be located on the center line CL. The semiconductor module 100 according to the modification also achieves the same effects.

The side walls 36, 38, and 39 illustrated in FIGS. 12 to 15 are common in a point that each includes a set of the side wall elements 36L, 38L, and 39L extending in the y axis direction and facing each other, a set of the side wall elements 36S, 38S, and 39S extending in the x axis direction and facing each other, the end portions of the side wall elements 36L, 38L, and 39L, and the slope portions 37, 37S, and 37L connecting the end portions of the side wall elements 36S, 38S, and 39S. The slope portions 37, 37S, and 37L are inclined toward the inner side of the side walls 36, 38, and 39, and may extend to intersect at an angle of, for example, 30 degrees or more and 60 degrees or less with respect to the y axis direction.

FIGS. 12, 13, 14, and 15 each are diagrams illustrating metal layers 87, 88, 89, and 90 of a modification of the metal layer 85 of the semiconductor device 70 in the semiconductor module 100 according to an embodiment of the invention. The metal layers 87, 88, 89, and 90 are substantially rectangular in a plan view, have a set of sides extending in the x axis direction and a set of sides extending in the y axis direction, and includes a plurality of corners or arcs provided by chamfering.

Figure 12:
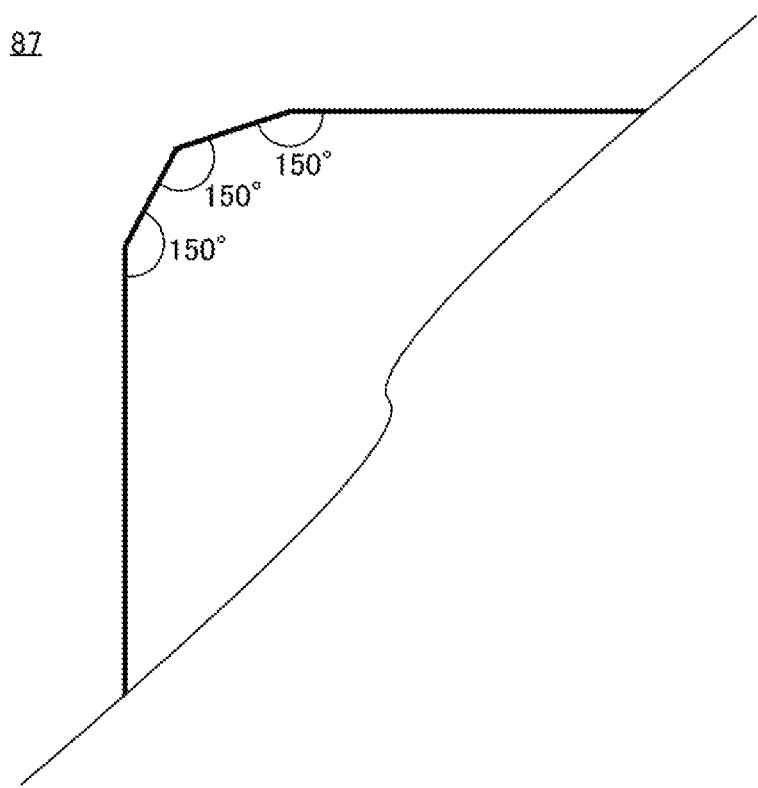
FIG. 12 is a diagram illustrating a metal layer 87 which is a modification of the metal layer 85 of the semiconductor device 70 in the semiconductor module 100 according to an embodiment of the invention.
Figure 13:
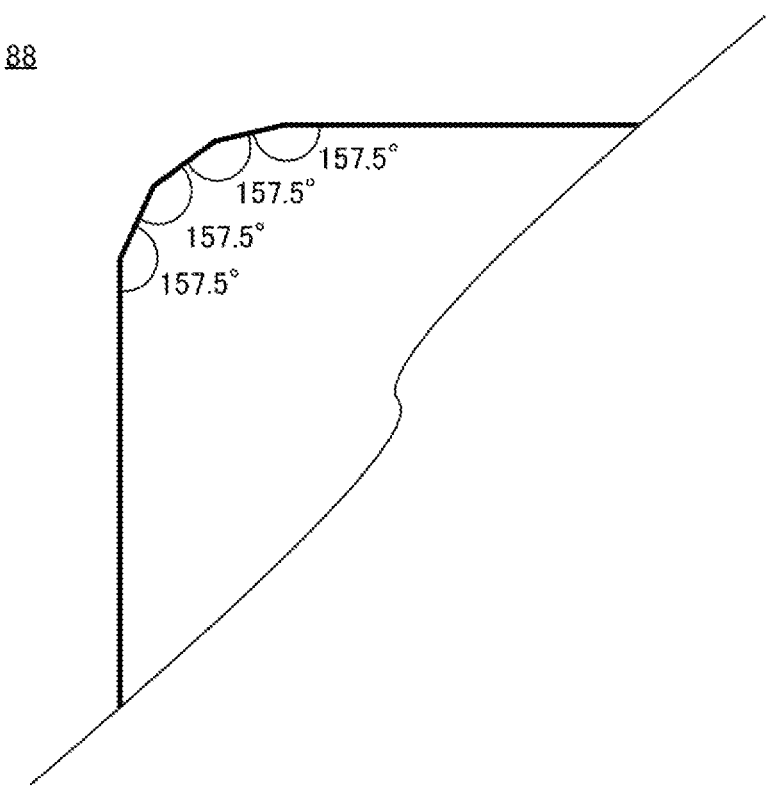
FIG. 13 is a diagram illustrating a metal layer 88 which is a modification of the metal layer 85 of the semiconductor device 70 in the semiconductor module 100 according to an embodiment of the invention.
Figure 14:
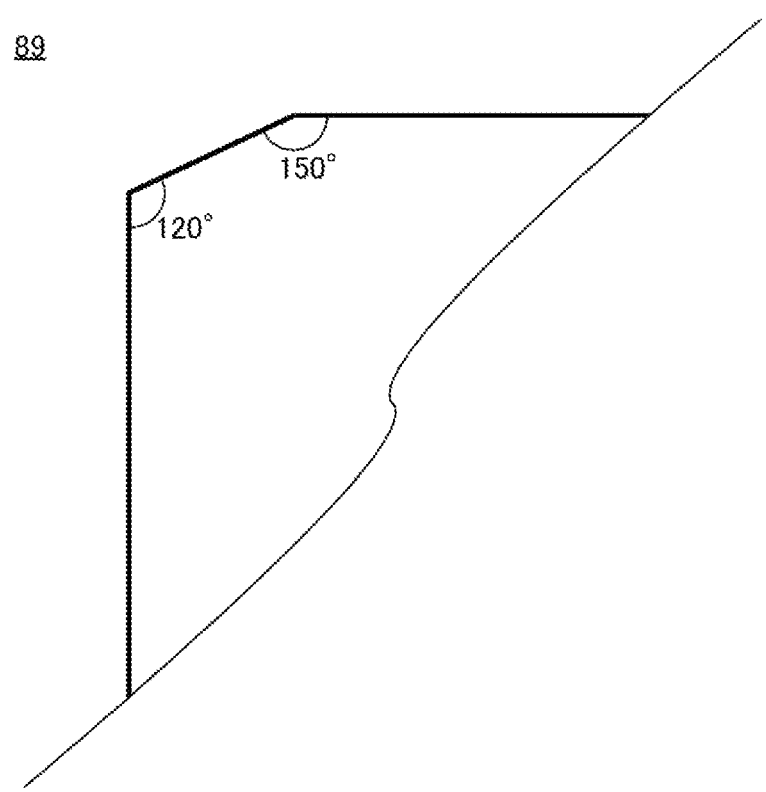
FIG. 14 is a diagram illustrating a metal layer 89 which is a modification of the metal layer 85 of the semiconductor device 70 in the semiconductor module 100 according to an embodiment of the invention.
Figure 15:
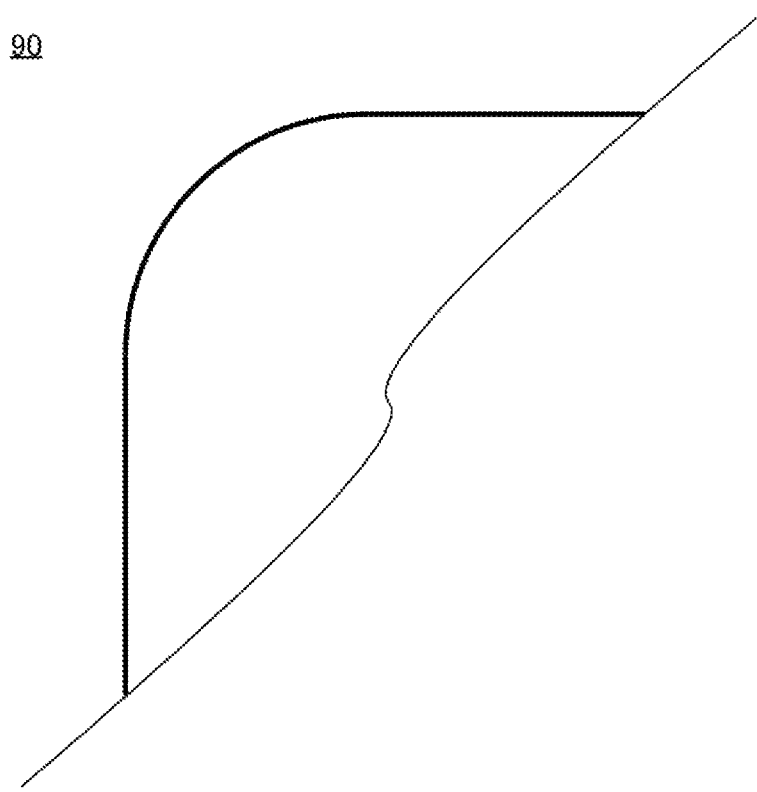
FIG. 15 is a diagram illustrating a metal layer 90 which is a modification of the metal layer 85 of the semiconductor device 70 in the semiconductor module 100 according to an embodiment of the invention.

As a difference from the semiconductor module 100 according to the embodiments described using FIGS. 1 to 11, the metal layer 87 illustrated in FIG. 12 has a 12-angled shape of which the interior angle of the corner is 150° in a plan view, and the metal layer 88 illustrated in FIG. 13 has a 16-angled shape of which the interior angle of the corner is 157.5° in a plan view. In addition, the metal layer 89 illustrated in FIG. 14 has an 8-angled shape which includes two different angles, 120° and 150° of the corner in a plan view, and the metal layer 90 illustrated in FIG. 15 has a shape having no corner including an arc connecting two sides adjacent to the corner in a plan view. The semiconductor module 100 according to these modifications also achieves the same effects.

Figure 16:
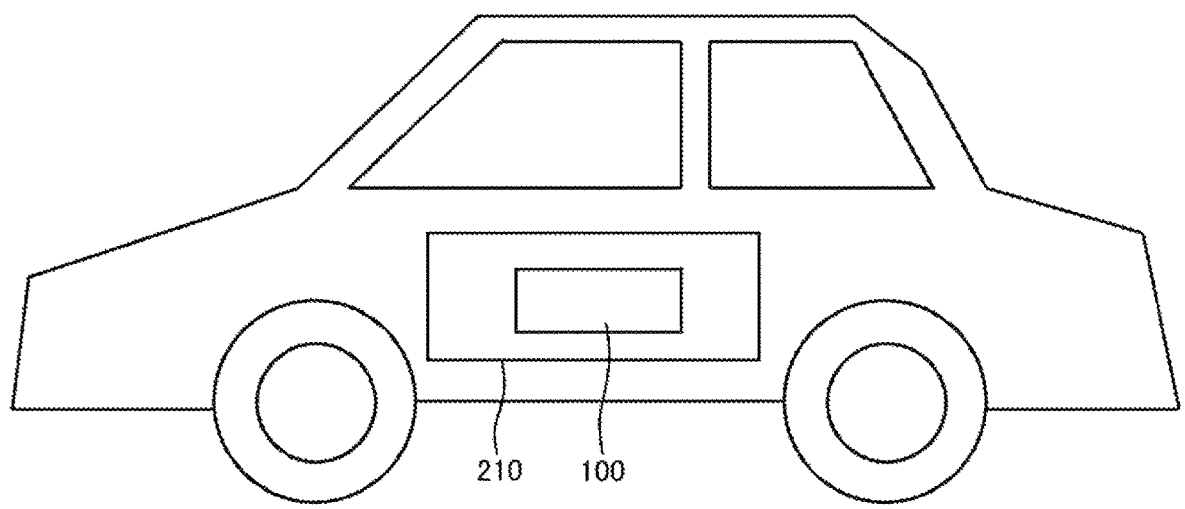
FIG. 16 is a diagram illustrating the outline of a vehicle 200 according to an embodiment of the invention.

FIG. 16 is a diagram illustrating the outline of a vehicle 200 according to an embodiment of the invention. The vehicle 200 is a vehicle which generates at least a part of propulsive force by electric power. As an example, the vehicle 200 is an electric vehicle in which all propulsive forces are generated by a power driving device such as a motor, or a hybrid vehicle in which a power driving device such as a motor and an internal combustion engine driven by fuel such as gasoline are used together.

The vehicle 200 includes a control device 210 (external device) which controls the power driving device such as a motor. In the control device 210, the semiconductor module 100 is provided. The semiconductor module 100 may control the power to be supplied to the power driving device.

Figure 17:
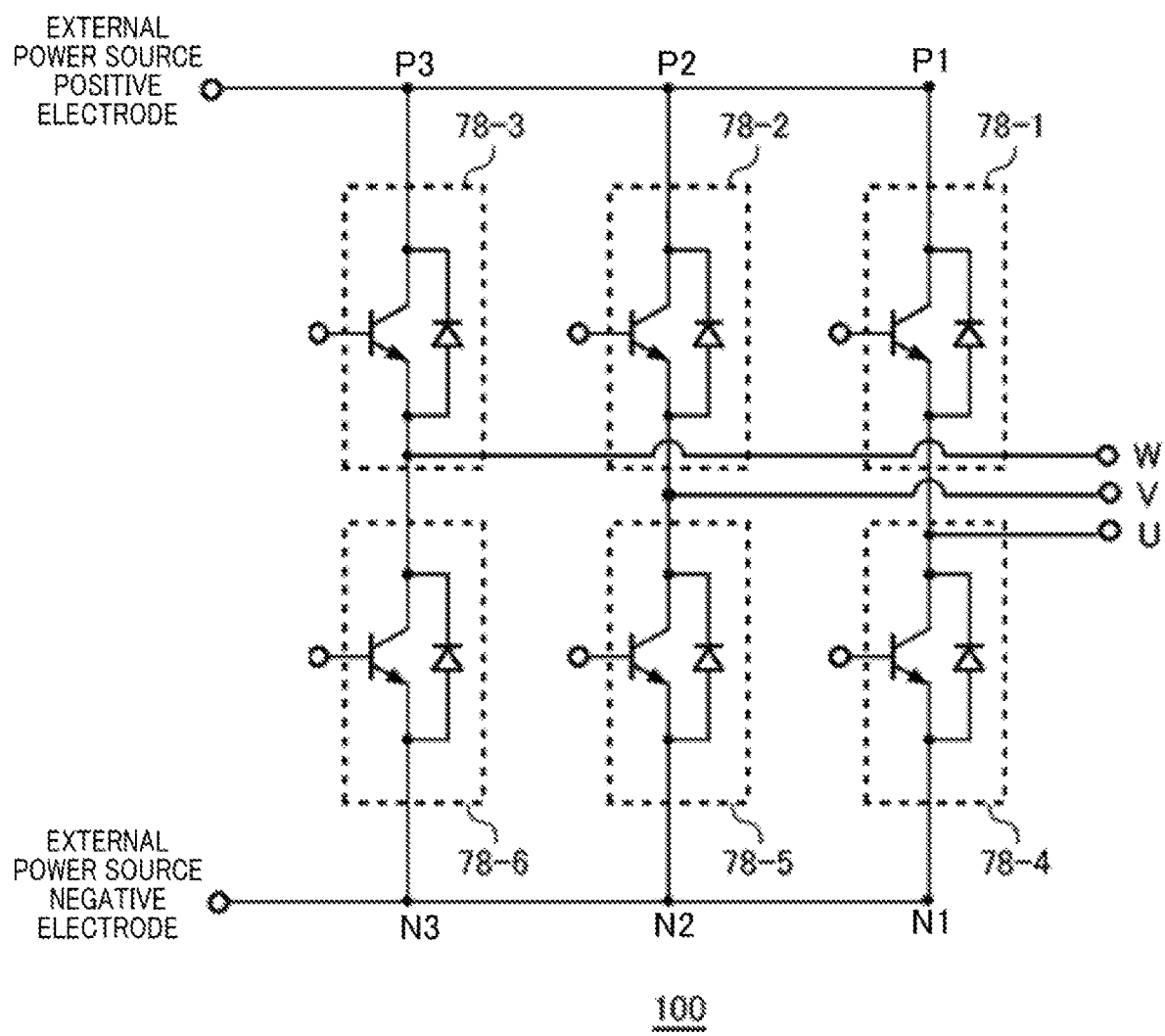
FIG. 17 is a main circuit diagram of the semiconductor module 100 according to an embodiment of the invention.

FIG. 17 is a main circuit diagram of the semiconductor module 100 according to the plurality of embodiments of the invention. The semiconductor module 100 functions as a three-phase AC inverter circuit which includes output terminals U, V, and W, and may be a part of an in-vehicle unit which drives the motor of the vehicle.

In the semiconductor module 100, the semiconductor chips 78-1, 78-2, and 78-3 may form an upper arm, and the semiconductor chips 78-4, 78-5, and 78-6 may form a lower arm. A set of semiconductor chips 78-1 and 78-4 may form a leg (U phase). Likewise, a set of semiconductor chips 78-2 and 78-5, and a set of semiconductor chips 78-3 and 78-6 may also form legs (V phase, W phase). In the semiconductor chip 78-4, the emitter electrode is electrically connected to an input terminal N1, and the collector electrode to the output terminal U. In the semiconductor chip 78-1, the emitter electrode is electrically connected to the output terminal U, and the collector electrode to an input terminal P1. Likewise, in the semiconductor chips 78-5 and 78-6, the emitter electrode may be electrically connected to the input terminals N2 and N3 respectively, and the collector electrodes to the output terminals V and W respectively. Further, in the semiconductor chips 78-2 and 78-3, the emitter electrode may be electrically connected to the output terminals V and W respectively, and the collector electrodes to the input terminals P2 and P3 respectively.

The semiconductor chips 78-1 to 78-6 each are switched alternatively by a signal input to the corresponding control terminal. In this example, each semiconductor chip 78 may generate heat at the time of switching. The input terminals P1, P2, and P3 may be connected to the positive electrode of an external power source, the input terminals N1, N2, and N3 to the negative electrode of the external power source, and the output terminals U, V, and W to a load respectively. The input terminals P1, P2, and P3 may be electrically connected to each other, and the other input terminals N1, N2, and N3 may also be electrically connected to each other.

In the semiconductor module 100, the plurality of semiconductor chips 78-1 to 78-6 each may be an RC-IGBT (reverse conduction IGBT) semiconductor chip. In addition, the semiconductor chips 78-1 to 78-6 each may include a combination of transistors such as MOSFET or IGBT and diodes.

In the above description of the plurality of embodiments, for example, words such as "substantially equal", "substantially the same", "substantially constant", "substantially symmetrical", "substantially rhombic", "substantially rectangular", etc. may be used together to describe a specific state, but it is intended that they include not only the specific state in a strict sense, but also the specific state in general.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

For example, in the above embodiments, the semiconductor module 100 has been described to have three semiconductor devices 70, but instead of this, may include one, two, or four or more semiconductor devices 70.

For example, in the refrigerant circulating portion 92 defined by the side walls 36, 38, and 39, the first refrigerant passage 30-1 is arranged side by side on one side of the direction of the short side of the fin region 95, and the second refrigerant passage 30-2 is arranged on the other side. The cooling pin fin 94 may be arranged between the first refrigerant passage 30-1 and the second refrigerant passage 30-2. In addition, for example, the cooling pin fin 94 may be disposed in a grid pattern, preferably a slant grid pattern, or a rhombic grid pattern. In addition, for example, the inlet 41 and the outlet 42 may be provided adjacent to the fin region 95 and on the diagonal line in the refrigerant circulating portion 92. In addition, for example, the openings of the inlet 41 and the outlet 42 may have a length in the direction of the long side 96 longer than the length in the direction of the short side 93 in a plan view.

For example, in the above embodiments, the top plate 20, the side walls 36, 38, and 39, and the cooling pin fin 94 have been described to be integrally formed in the base plate 40, but instead of this, the top plate 20, the side wall 36 and the like, and the cooling pin fin 94 may be individually formed and then fixed to each other with the fixing agent 98 or the like. In addition, the top plate 20 and the side wall 36 are integrally formed, and the individually-formed cooling pin fin 94 may be fixed to the top plate 20. In addition, the top plate 20 and the cooling pin fin 94 are integrally formed, and the individually-formed side wall 36 and the like may be fixed to the top plate 20 by the fixing agent 98 or the like. In addition, the side wall 36 and the like and the bottom plate 64 may be integrally formed by, for example, drawing, and the individually-formed top plate 20 may be fixed to the side wall 36 and the like with the fixing agent 98 or the like, for example, by brazing. In this case, the side wall 36 and the like extend in the xy plane up to the region where the fastening portion 21 of the top plate 20 is located, and the extending surfaces of the side wall 36 and the like and the lower surface 24 of the top plate 20 may be connected.

In addition, for example, in the above embodiments, the cooling pin fin 94 has been described to be integrally formed with the top plate 20, and extend toward the bottom plate 64, but instead of this, the cooling pin fin 94 may be integrally formed with the bottom plate 64, and extend from the bottom plate 64 toward the top plate 20. Further, in this case, the edge of the cooling pin fin 94 and the top plate 20 may be fixed by the fixing agent 98 or the like.

In addition, for example, in the above embodiment, the cooling pin fin 94 has been described to extend in the diagonal direction of the main surface of the top plate 20 between the top plate 20 and the bottom plate 64, that is, extend in a direction perpendicular to the top plate 20 and the bottom plate 64, but instead of this, the cooling pin fin 94 may extend with an angle with respect to the normal direction of the main surface of the top plate 20 between the top plate 20 and the bottom plate 64. In addition, the dimension of the cross section in the xy plane of the cooling pin fin 94 may be constant or may change in the z axis direction, or as a more specific example, the cooling pin fin may extend from any one of the top plate 20 and the bottom plate 64 to the other such that the dimension may be tapered toward the edge.

In addition, for example, in the above embodiment, the inlet 41 for introducing the refrigerant to the refrigerant circulating portion 92, and the outlet 42 for leading the refrigerant from the refrigerant circulating portion 92 have been described to form the bottom plate 64, but instead of this, the inlet 41 and the outlet 42 may be formed in the side walls 36, 38, and 39. In this case, the inlet 41 and the outlet 42 may be formed in two side surfaces facing in the x axis direction of the side wall 36 and the like.

In addition, for example, in the above embodiments, the inner sides of the side walls 36, 38, and 39 have been described as a straight line in a plan view, but it is not limited to a straight line and may be a broken line or a curved line. For example, in a plan view, the inner sides of the side wall 36 and the like may be a curve that bulges in an arc shape on the side of the refrigerant circulating portion 92, or may be a curve that is concave in an arc shape on the opposite side.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES 10 cooling device
20 top plate
21 fastening portion
22 upper surface
24 lower surface
30 refrigerant passage
30-1 first refrigerant passage
30-2 second refrigerant passage
36, 38, 39 side wall
36S, 36L, 38S, 38L, 39S, 39L side wall element
37, 37S, 37L slope portion
40 base plate
41 inlet
42 outlet
64 bottom plate
70 semiconductor device
70U U-phase unit
70V V-phase unit
70W W-phase unit
72 receiving portion
74 sealing portion
76 circuit board
78 semiconductor chip
79 solder
80 through hole
81 insulating plate
83 circuit layer
85, 86, 87, 88, 89, 90 metal layer
92 refrigerant circulating portion
93 short side
96 long side
94 cooling pin fin
95 fin region
98 fixing agent
100 semiconductor module
200 vehicle
210 control device

What is claimed is:

1. A semiconductor module, comprising:
a semiconductor device; and
a cooling device,
wherein the semiconductor device includes a semiconductor chip and a circuit board for mounting the semiconductor chip,
wherein the cooling device includes;
a top plate which is mounted in the semiconductor device;
a side wall which is connected to the top plate;
a bottom plate which is connected to the side wall and faces the top plate; and
a refrigerant circulating portion for circulating a refrigerant, which is defined by the top plate, the side wall, and the bottom plate and has a substantially rectangular shape of which a cross section parallel to a main surface of the top plate has a long side and a short side,
wherein the circuit board is a substantially rectangular laminated circuit board which sequentially includes an insulating plate having an upper surface and a lower surface, a circuit layer provided in the upper surface, and a metal layer provided in the lower surface,
wherein, in a plan view, the side wall includes a slope portion which is inclined inward to form an angle with respect to each of a direction of the long side and a direction of the short side at least at one corner, and
wherein, in a plan view, at least one corner of the metal layer is at least partially overlapped with the slope portion.

2. The semiconductor module according to claim 1, wherein, in a plan view, a contour of the at least one corner of the metal layer is located between an inner side and an outer side of the slope portion.

3. The semiconductor module according to claim 1, wherein, in a plan view, portions other than the corner of the metal layer are not overlapped with the side wall.

4. The semiconductor module according to claim 1, wherein the side wall includes two of the slope portions at least at two corners, and
wherein, in a plan view, two corners of the metal layer are at least partially overlapped with the two slope portions.

5. The semiconductor module according to claim 1, wherein a length of one side on an inner side of the side wall in the direction of the short side is shorter than a length of one side of the metal layer of the circuit board.

6. The semiconductor module according to claim 1, wherein the insulating plate contains ceramic, and
wherein the metal layer is fixed to the top plate by a solder.

7. The semiconductor module according to claim 1, wherein the top plate and the side wall are integrally configured.

8. The semiconductor module according to claim 7, wherein the top plate and the side wall are integrally formed.

9. The semiconductor module according to claim 7, wherein the top plate and the side wall are fixed by a fixing agent.

10. The semiconductor module according to claim 7, wherein a thickness of a cross section of the top plate in a plane orthogonal to a direction in a plan view is thicker on an outer side than on an inner side of the side wall.

11. A semiconductor module, comprising:
a semiconductor device; and
a cooling device,
wherein the semiconductor device includes:
a semiconductor chip; and
a circuit board which includes an insulating plate having an upper surface and a lower surface, a circuit layer provided in the upper surface, and a metal layer provided in the lower surface, and mounts the semiconductor chip on the circuit layer,
wherein the cooling device includes:
a top plate in which the semiconductor device is mounted;
a side wall which is connected to the top plate;
a bottom plate which is connected to the side wall and faces the top plate; and
a refrigerant circulating portion for circulating a refrigerant, which is defined by the top plate, the side wall, and the bottom plate,
wherein the side wall includes a set of first side wall elements which extend in one direction and face each other, a set of second side wall elements which extend in another direction and face each other, and a slope portion which connects an end portion of the first side wall element and an end portion of the second side wall element, and
wherein, in a plan view, the metal layer is a substantially rectangular shape, and a corner of the metal layer is partially overlapped with the slope portion.

12. The semiconductor module according to claim 11,
wherein the side wall includes four of the slope portions, and
wherein, in a plan view, a length of the second side wall element is shorter than a length of the first side wall element, and a length of the second side wall element is shorter than a length of one side of the metal layer.

13. The semiconductor module according to claim 11,
wherein the side wall includes two of the slope portions.

14. A vehicle, comprising:
the semiconductor module according to claim 1.

15. The semiconductor module according to claim 11,
wherein, in a plan view, the one direction and the another direction are orthogonal, and an extending direction of the slope portion and the one direction intersect at an angle of 30 degrees or more and 60 degrees or less.

* * * * *